(12) United States Patent
Shirakawa et al.

(10) Patent No.: US 9,080,103 B2
(45) Date of Patent: *Jul. 14, 2015

(54) PHOSPHOR LAYER ATTACHING KIT, OPTICAL SEMICONDUCTOR ELEMENT-PHOSPHOR LAYER ATTACHING BODY, AND OPTICAL SEMICONDUCTOR DEVICE

(71) Applicant: NITTO DENKO CORPORATION, Ibaraki-shi, Osaka (JP)

(72) Inventors: Masahiro Shirakawa, Osaka (JP); Hironaka Fujii, Osaka (JP); Hisataka Ito, Osaka (JP)

(73) Assignee: NITTO DENKO CORPORATION, Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/030,698

(22) Filed: Sep. 18, 2013

(65) Prior Publication Data
US 2014/0091347 A1    Apr. 3, 2014

(30) Foreign Application Priority Data
Sep. 28, 2012    (JP) ................. 2012-216863

(51) Int. Cl.
| | | |
|---|---|---|
| *H01L 33/00* | (2010.01) | |
| *C09K 11/77* | (2006.01) | |
| *C09J 183/04* | (2006.01) | |
| *C09J 183/08* | (2006.01) | |
| *H01L 33/50* | (2010.01) | |
| *C09K 11/08* | (2006.01) | |
| *C09J 7/02* | (2006.01) | |
| *C08G 77/26* | (2006.01) | |

(52) U.S. Cl.
CPC ............. *C09K 11/7721* (2013.01); *C09J 7/026* (2013.01); *C09J 7/0207* (2013.01); *C09J 183/04* (2013.01); *C09J 183/08* (2013.01); *C09K 11/08* (2013.01); *H01L 33/50* (2013.01); *H01L 33/505* (2013.01); *C08G 77/26* (2013.01); *C09J 2201/622* (2013.01); *C09J 2203/326* (2013.01); *C09J 2483/00* (2013.01); *H01L 2924/0002* (2013.01); *H01L 2933/0041* (2013.01); *Y10T 428/2852* (2015.01)

(58) Field of Classification Search
CPC ...... C09J 7/0207; C09J 183/08; C09J 183/04; C09J 7/026; H01L 33/505; H01L 33/50; C09K 11/7721; C09K 11/08; C08K 5/14; C08K 5/5415; C08K 5/29
See application file for complete search history.

(56) References Cited

U.S. PATENT DOCUMENTS

| | | | | |
|---|---|---|---|---|
| 7,294,861 | B2 * | 11/2007 | Schardt et al. | 257/81 |
| 2010/0178496 | A1 * | 7/2010 | Masuda et al. | 428/347 |
| 2011/0318577 | A1 * | 12/2011 | Masuda | 428/352 |
| 2013/0280527 | A1 * | 10/2013 | Niimi et al. | 428/354 |
| 2014/0091346 | A1 * | 4/2014 | Fujii et al. | 257/98 |

OTHER PUBLICATIONS

Extended European Search Report dated Feb. 4, 2014, issued by the European Patent Office in corresponding European Application No. 13185712.0.

* cited by examiner

*Primary Examiner* — Benjamin Sansvik
*Assistant Examiner* — Farid Khan
(74) *Attorney, Agent, or Firm* — Sughrue Mion, PLLC

(57) ABSTRACT

A phosphor layer attaching kit includes a phosphor layer and a silicone pressure-sensitive adhesion composition for attaching the phosphor layer to an optical semiconductor element or an optical semiconductor element package. A percentage of the peel strength of the silicone pressure-sensitive adhesion composition is 30% or more.

6 Claims, 9 Drawing Sheets

7

PHOSPHOR LAYER ATTACHING KIT, OPTICAL SEMICONDUCTOR ELEMENT-PHOSPHOR LAYER ATTACHING BODY, AND OPTICAL SEMICONDUCTOR DEVICE

CROSS-REFERENCE TO RELATED APPLICATION

The present application claims priority from Japanese Patent Application No. 2012-216863 filed on Sep. 28, 2012, the contents of which are hereby incorporated by reference into this application.

BACKGROUND OF THE INVENTION

1. Field of the Invention

The present invention relates to a phosphor layer attaching kit, an optical semiconductor element-phosphor layer attaching body, and an optical semiconductor device, to be specific, to a phosphor layer attaching kit for attaching a phosphor layer to an optical semiconductor element or an optical semiconductor element package, an optical semiconductor element-phosphor layer attaching body, and an optical semiconductor device.

2. Description of Related Art

An optical semiconductor device such as a light emitting diode device (hereinafter, simply referred to as an LED device) and a laser diode irradiation device (hereinafter, simply referred to as an LD irradiation device) includes, for example, an optical semiconductor element such as a light emitting diode element (an LED) and a laser diode (an LD) and a phosphor layer that is disposed on the optical semiconductor element. Such an optical semiconductor device emits white light by color mixing of blue light that is emitted from the optical semiconductor element and transmits through, for example, the phosphor layer and yellow light that is converted in wavelength from a part of the blue light in the phosphor layer.

As such an optical semiconductor device, an LED device that is provided with an LED package in which an LED is encapsulated by a transparent encapsulating material and a phosphor tape that is laminated on the upper surface thereof has been proposed (ref: for example, U.S. Pat. No. 7,294,861).

The phosphor tape in U.S. Pat. No. 7,294,861 includes a phosphor layer and an acrylic pressure-sensitive adhesive layer that is laminated on the back surface thereof and is prepared from a (meth)acrylate-based pressure-sensitive adhesive. The phosphor layer is attached to the surface of the LED package via the acrylic pressure-sensitive adhesive layer.

SUMMARY OF THE INVENTION

The temperature of the phosphor tape, however, is easily increased to be a high temperature by light emission of the LED and in the phosphor tape in U.S. Pat. No. 7,294,861, there is a disadvantage that an adhesive force at a high temperature (for example, a high temperature including 75° C.) is remarkably reduced compared to the adhesive force at a normal temperature (25° C.).

In addition, there is also a disadvantage that when the phosphor tape in U.S. Pat. No. 7,294,861 is used at a high temperature for a long time, it is deteriorated, so that the brightness of the LED device is reduced.

It is an object of the present invention to provide a phosphor layer attaching kit, an optical semiconductor element-phosphor layer attaching body, and an optical semiconductor device, each of which has excellent heat resistance and durability.

A phosphor layer attaching kit of the present invention includes a phosphor layer and a silicone pressure-sensitive adhesion composition for attaching the phosphor layer to an optical semiconductor element or an optical semiconductor element package, wherein a percentage of the following peel strength of the silicone pressure-sensitive adhesion composition is 30% or more.

Percentage of peel strength=[(peel strength $PS_{75°\,C.}$ in an atmosphere at 75° C.)/(peel strength $PS_{25°\,C.}$ in an atmosphere at 25° C.)]×100

Peel Strength $PS_{75°\,C.}$ in an atmosphere at 75° C.: a peel strength at a temperature of 75° C. at the time of peeling a support and a pressure-sensitive adhesion layer from the phosphor layer at a peel angle of 180 degrees and a rate of 300 mm/min after attaching the pressure-sensitive adhesion layer formed from the silicone pressure-sensitive adhesion composition and laminated on the support to the phosphor layer.

Peel Strength $PS_{25°\,C.}$ in an atmosphere at 25° C.: a peel strength at a temperature of 25° C. at the time of peeling a support and a pressure-sensitive adhesion layer from the phosphor layer at a peel angle of 180 degrees and a rate of 300 mm/min after attaching the pressure-sensitive adhesion layer formed from the silicone pressure-sensitive adhesion composition and laminated on the support to the phosphor layer.

In the phosphor layer attaching kit of the present invention, it is preferable that the silicone pressure-sensitive adhesion composition is a silicone pressure-sensitive adhesive composition.

In the phosphor layer attaching kit of the present invention, it is preferable that the silicone pressure-sensitive adhesion composition is a silicone thermoplastic-thermosetting adhesive composition having both thermoplastic properties and thermosetting properties.

An optical semiconductor element-phosphor layer attaching body of the present invention includes an optical semiconductor element, and a phosphor attaching sheet fabricated from a phosphor layer attaching kit including a phosphor layer and a silicone pressure-sensitive adhesion composition for attaching the phosphor layer to the optical semiconductor element and allowing the phosphor layer to be attached to the optical semiconductor element via the silicone pressure-sensitive adhesion composition, wherein a percentage of the following peel strength of the silicone pressure-sensitive adhesion composition is 30% or more.

Percentage of peel strength=[(peel strength $PS_{75°\,C.}$ in an atmosphere at 75° C.)/(peel strength $PS_{25°\,C.}$ in an atmosphere at 25° C.)]×100

Peel Strength $PS_{75°\,C.}$ in an atmosphere at 75° C.: a peel strength at a temperature of 75° C. at the time of peeling a support and a pressure-sensitive adhesion layer from the phosphor layer at a peel angle of 180 degrees and a rate of 300 mm/min after attaching the pressure-sensitive adhesion layer formed from the silicone pressure-sensitive adhesion composition and laminated on the support to the phosphor layer.

Peel Strength $PS_{25°\,C.}$ in an atmosphere at 25° C.: a peel strength at a temperature of 25° C. at the time of peeling a support and a pressure-sensitive adhesion layer from the phosphor layer at a peel angle of 180 degrees and a rate of 300 mm/min after attaching the pressure-sensitive adhesion layer formed from the silicone pressure-sensitive adhesion composition and laminated on the support to the phosphor layer.

An optical semiconductor device of the present invention includes a substrate, an optical semiconductor element to be mounted on the substrate, and a phosphor attaching sheet fabricated from a phosphor layer attaching kit including a phosphor layer and a silicone pressure-sensitive adhesion composition for attaching the phosphor layer to the optical semiconductor element and allowing the phosphor layer to be attached to the optical semiconductor element via the silicone pressure-sensitive adhesion composition, wherein a percentage of the following peel strength of the silicone pressure-sensitive adhesion composition is 30% or more.

Percentage of peel strength=[(peel strength $PS_{75°\,C.}$ in an atmosphere at 75° C.)/(peel strength $PS_{25°\,C.}$ in an atmosphere at 25° C.)]×100

Peel Strength $PS_{75°\,C.}$ in an atmosphere at 75° C.: a peel strength at a temperature of 75° C. at the time of peeling a support and a pressure-sensitive adhesion layer from the phosphor layer at a peel angle of 180 degrees and a rate of 300 mm/min after attaching the pressure-sensitive adhesion layer formed from the silicone pressure-sensitive adhesion composition and laminated on the support to the phosphor layer.

Peel Strength $PS_{25°\,C.}$ in an atmosphere at 25° C.: a peel strength at a temperature of 25° C. at the time of peeling a support and a pressure-sensitive adhesion layer from the phosphor layer at a peel angle of 180 degrees and a rate of 300 mm/min after attaching the pressure-sensitive adhesion layer formed from the silicone pressure-sensitive adhesion composition and laminated on the support to the phosphor layer.

An optical semiconductor device of the present invention includes an optical semiconductor package including a substrate, an optical semiconductor element to be mounted on the substrate, a reflector formed at one side in a thickness direction of the substrate and disposed, when projected in the thickness direction, so as to surround the optical semiconductor element, and an encapsulating layer filling the inside of the reflector and encapsulating the optical semiconductor element and a phosphor attaching sheet fabricated from a phosphor layer attaching kit including a phosphor layer and a silicone pressure-sensitive adhesion composition for attaching the phosphor layer to the optical semiconductor element package and allowing the phosphor layer to be attached to the one side in the thickness direction of the optical semiconductor package via the silicone pressure-sensitive adhesion composition, wherein a percentage of the following peel strength of the silicone pressure-sensitive adhesion composition is 30% or more.

Percentage of peel strength=[(peel strength $PS_{75°\,C.}$ in an atmosphere at 75° C.)/(peel strength $PS_{25°\,C.}$ in an atmosphere at 25° C.)]×100

Peel Strength $PS_{75°\,C.}$ in an atmosphere at 75° C.: a peel strength at a temperature of 75° C. at the time of peeling a support and a pressure-sensitive adhesion layer from the phosphor layer at a peel angle of 180 degrees and a rate of 300 mm/min after attaching the pressure-sensitive adhesion layer formed from the silicone pressure-sensitive adhesion composition and laminated on the support to the phosphor layer.

Peel Strength $PS_{25°\,C.}$ in an atmosphere at 25° C.: a peel strength at a temperature of 25° C. at the time of peeling a support and a pressure-sensitive adhesion layer from the phosphor layer at a peel angle of 180 degrees and a rate of 300 mm/min after attaching the pressure-sensitive adhesion layer formed from the silicone pressure-sensitive adhesion composition and laminated on the support to the phosphor layer.

In the phosphor layer attaching kit of the present invention, the percentage of the peel strength of the silicone pressure-sensitive adhesion composition for attaching the phosphor layer to the optical semiconductor element or the optical semiconductor element package is 30% or more, so that it has excellent heat resistance and durability.

Thus, the optical semiconductor element-phosphor layer attaching body and the optical semiconductor device of the present invention are capable of ensuring excellent light emitting reliability over a long period of time.

BRIEF DESCRIPTION OF THE DRAWINGS

FIG. 2 (a) illustrating a step of preparing a phosphor layer,

FIG. 2 (b) illustrating a step of laminating a silicone pressure-sensitive adhesion layer on the phosphor layer, and FIG. 2 (c) illustrating a step of attaching the phosphor layer to an LED.

FIG. 3 (a) illustrating a step of preparing an LED,

FIG. 3 (b) illustrating a step of laminating a silicone pressure-sensitive adhesion layer on the LED, and FIG. 3 (c) illustrating a step of attaching the LED to a phosphor layer.

FIG. 4 (a) illustrating a step of preparing a substrate and the LED-phosphor layer attaching body and FIG. 4 (b) illustrating a step of mounting an LED in the LED-phosphor layer attaching body on the substrate.

FIG. 5 (a) illustrating a step of preparing a substrate and an LED-phosphor layer attaching body and FIG. 5 (b) illustrating a step of mounting an LED in the LED-phosphor layer attaching body on the substrate.

FIG. 6 (a) illustrating a step of preparing a substrate on which an LED is mounted and a phosphor attaching sheet and FIG. 6 (b) illustrating a step of attaching the phosphor attaching sheet to the LED to fabricate an LED-phosphor layer attaching body.

FIG. 7 (a) illustrating a step of preparing a substrate on which an LED is mounted and a phosphor attaching sheet and FIG. 7 (b) illustrating a step of attaching the phosphor attaching sheet to the LED to fabricate an LED-phosphor layer attaching body.

FIG. 8 (a) illustrating a step of preparing an LED package and a phosphor attaching sheet and FIG. 8 (b) illustrating a step of attaching the phosphor attaching sheet to the LED package.

FIG. 9(a)-(b) shows process drawings for illustrating another embodiment of a method for producing an LED device:

DETAILED DESCRIPTION OF THE INVENTION

<Phosphor Layer Attaching Kit>

Figure 2A:
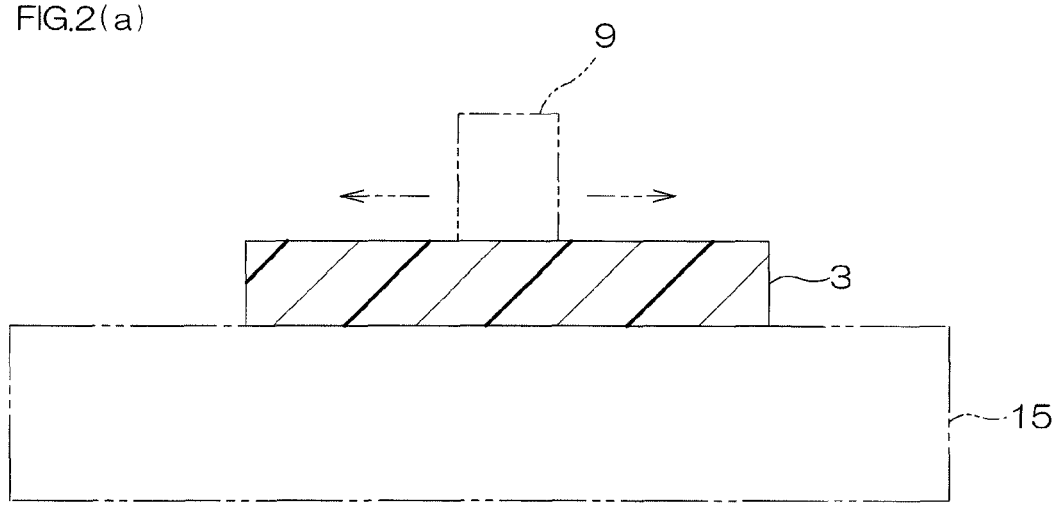
FIG. 2(a)-(c) shows process drawings for illustrating a method for producing the LED-phosphor layer attaching body shown in FIG. 1.
Figure 2B:
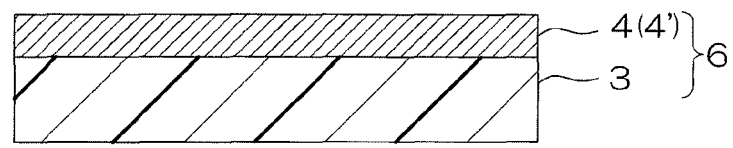
Figure 2C:
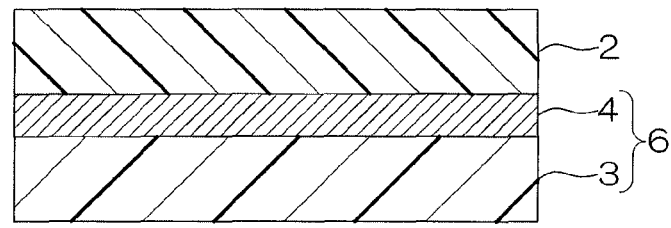
Figure 8A:
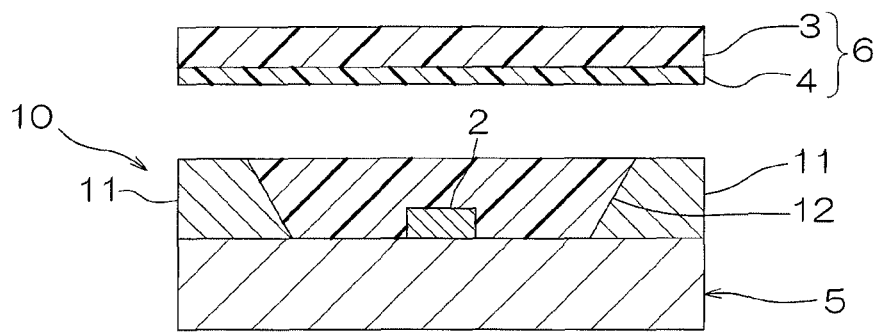
FIG. 8(a)-(b) shows process drawings for illustrating another embodiment of a method for producing an LED device.
Figure 8B:
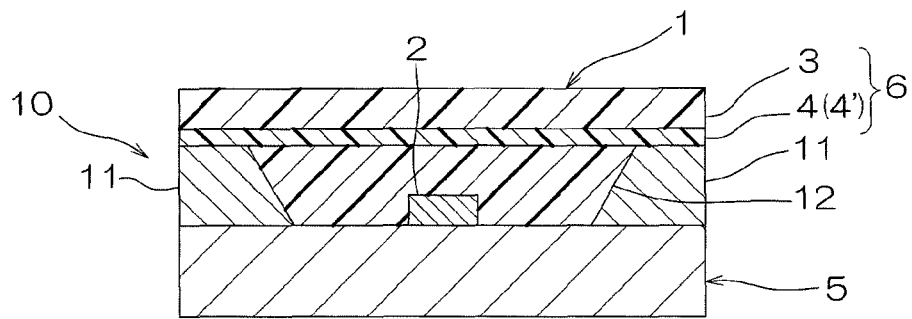

A phosphor layer attaching kit of the present invention includes a phosphor layer (ref: a numeral 3 in FIG. 2(a)-(c) to be described later) and a silicone pressure-sensitive adhesion composition for attaching the phosphor layer to an LED (ref: a numeral 2 in FIG. 2(a)-(c) to be described later) as an optical semiconductor element or an LED package (ref: a numeral 10 in FIG. 8(a)-(b) to be described later) as an optical semiconductor element package. In the phosphor layer attaching kit, the phosphor layer and the silicone pressure-sensitive adhesion composition are distributed and sold at the same time or separately, and are used at the same time. At the time of using the phosphor layer attaching kit, for example, the silicone pressure-sensitive adhesion composition is laminated on the phosphor layer and the phosphor layer is attached to the LED or the LED package via the silicone pressure-sensitive adhesion composition. Alternatively, the silicone pressure-sensitive adhesion composition is laminated on the LED or the LED package and thereafter, the phosphor layer is attached to the LED or the LED package via the silicone pressure-sensitive adhesion composition.

The phosphor layer is, for example, a wavelength conversion layer (a phosphor sheet) that converts a part of blue light emitted from the LED to yellow light. The phosphor layer is also capable of converting a part of the blue light into red light in accordance with the use and the purpose in addition to the above-described wavelength conversion. The phosphor layer is formed into a plate shape or a sheet shape. The phosphor layer is formed of, for example, a ceramic of a phosphor as a phosphor ceramic plate or is formed from a phosphor resin composition containing a phosphor and a resin as a phosphor resin sheet.

The phosphor is excited by absorbing a part or all of light at the wavelength of 350 to 480 nm as an exciting light and emits a fluorescent light whose wavelength is longer than that of the exciting light, for example, in the range of 500 to 650 nm. To be specific, an example of the phosphor includes a yellow phosphor. An example of the phosphor includes a phosphor obtained by doping a rare earth element such as cerium (Ce) or europium (Eu) into a composite metal oxide, a metal sulfide, or the like.

To be specific, examples of the phosphor include a garnet type phosphor having a garnet type crystal structure such as $Y_3Al_5O_{12}$:Ce (YAG (yttrium aluminum garnet):Ce), $(Y, Gd)_3(Al, Ga)_5O_{12}$:Ce, $Tb_3Al_3O_{12}$:Ce, $Lu_3Al_3O_{12}$:Ce, $Ca_3Sc_2Si_3O_{12}$:Ce, and $Lu_2CaMg_2(Si, Ge)_3O_{12}$:Ce; a silicate phosphor such as $(Sr, Ba)_2SiO_4$:Eu, $Ca_3SiO_4Cl_2$:Eu, $Sr_3SiO_5$:Eu, $Li_2SrSiO_4$:Eu, and $Ca_3Si_2O_7$:Eu; an aluminate phosphor such as $CaAl_{12}O_{19}$:Mn and $SrAl_2O_4$:Eu; a sulfide phosphor such as ZnS:Cu,Al, CaS:Eu, $CaGa_2S_4$:Eu, and $SrGa_2S_4$:Eu; an oxynitride phosphor such as $CaSi_2O_2N_2$:Eu, $SrSi_2O_2N_2$:Eu, $BaSi_2O_2N_2$:Eu, and Ca-α-SiAlON; a nitride phosphor such as $CaAlSiN_3$:Eu and $CaSi_5N_8$:Eu; and a fluoride-based phosphor such as $K_2SiF_6$:Mn and $K_2TiF_6$:Mn. Preferably, a garnet type phosphor is used, or more preferably, $Y_3Al_5O_{12}$:Ce (YAG) is used.

These phosphors can be used alone or in combination of two or more.

In order to form the phosphor layer as a phosphor ceramic plate, the phosphor layer (the phosphor ceramic) is obtained by sintering the above-described phosphor as a ceramic material. Alternatively, the phosphor layer (the phosphor ceramic) can be also obtained by a chemical reaction generated by sintering raw materials of the above-described phosphor.

When the phosphor ceramic is obtained, for example, an additive such as a binder resin, a dispersant, a plasticizer, and a sintering additive can be added at an appropriate proportion before the sintering.

On the other hand, when the phosphor layer is formed from a phosphor resin composition, for example, first, the above-described phosphor is blended with a resin, so that a phosphor resin composition is prepared.

The resin is a matrix in which a phosphor is dispersed. An example of the resin includes a transparent resin such as a silicone resin composition, an epoxy resin, and an acrylic resin. Preferably, in view of durability, a silicone resin composition is used.

The silicone resin composition has, in a molecule, a main chain that is mainly composed of a siloxane bond (—Si—O—Si—) and a side chain that is bonded to silicon atoms (Si) of the main chain and is composed of an organic group such as an alkyl group (for example, a methyl group), an aryl group (for example, a phenyl group), or an alkoxyl group (for example, a methoxy group).

To be specific, an example of the silicone resin composition includes a curable type silicone resin such as a dehydration condensation curable type silicone resin, an addition reaction curable type silicone resin, a peroxide curable type silicone resin, and a moisture curable type silicone resin.

The silicone resin composition has a kinetic viscosity at 25° C. of, for example, 10 to 30 $mm^2/s$.

These resins can be used alone or in combination of two or more.

The mixing proportion of the components is as follows. The mixing ratio of the phosphor with respect to the phosphor resin composition is, for example, 1 mass % or more, or preferably 5 mass % or more, and is, for example, 50 mass % or less, or preferably 30 mass % or less. The mixing ratio of the phosphor with respect to 100 parts by mass of the resin is, for example, 1 part by mass or more, or preferably 5 parts by mass or more, and is, for example, 100 parts by mass or less, or preferably 40 parts by mass or less.

The mixing ratio of the resin with respect to the phosphor resin composition is, for example, 50 mass % or more, or preferably 70 mass % or more, and is, for example, 99 mass % or less, or preferably 95 mass % or less.

The phosphor resin composition is prepared by blending the phosphor and the resin at the above-described mixing proportion to be stirred and mixed. The prepared phosphor resin composition is formed into a sheet shape and to be specific, is formed as a phosphor resin sheet.

When the resin contains a curable type silicone resin, the phosphor resin sheet is formed in a B-stage state or in a C-stage state. Furthermore, when the phosphor resin sheet is formed in a B-stage state, the phosphor resin sheet can be brought into a C-stage state by the subsequent heating.

In view of thermal conduction of generated heat by the LED and the phosphor layer, preferably, the phosphor layer is formed of a phosphor ceramic plate.

When the phosphor layer is formed as the phosphor ceramic plate, the thickness thereof is, for example, 50 μm or more, or preferably 100 μm or more, and is, for example, 1000 μm or less, or preferably 500 μm or less. When the phosphor layer is formed of the phosphor resin sheet, the thickness thereof is, in view of film forming properties and appearance of a device, for example, 25 μm or more, or preferably 50 μm or more, and is, for example, 1000 μm or less, or preferably 200 μm or less.

Examples of the silicone pressure-sensitive adhesion composition include a silicone pressure-sensitive adhesive composition and a silicone thermoplastic-thermosetting adhesive composition.

The silicone pressure-sensitive adhesive composition is, for example, prepared from a material containing a first polysiloxane, a second polysiloxane, a catalyst, and the like.

The first polysiloxane is a main material of the silicone pressure-sensitive adhesive composition and an example thereof includes a reactive polysiloxane such as a silanol group-containing polysiloxane.

An example of the silanol group-containing polysiloxane includes a polysiloxane containing silanol groups at both ends.

The polysiloxane containing silanol groups at both ends is an organosiloxane that contains silanol groups (SiOH groups) at both ends of a molecule and to be specific, is represented by the following general formula (A).

General Formula (A):

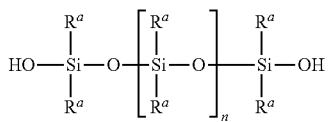

(A)

(where, in general formula (A), $R^a$ represents a monovalent hydrocarbon group selected from a saturated hydrocarbon group and an aromatic hydrocarbon group. "n" represents an integer of 1 or more.)

In the above-described general formula (A), in the monovalent hydrocarbon group represented by $R^a$, examples of the saturated hydrocarbon group include a straight chain or branched chain alkyl group having 1 to 6 carbon atoms (such as a methyl group, an ethyl group, a propyl group, an isopropyl group, a butyl group, an isobutyl group, a pentyl group, and a hexyl group) and a cycloalkyl group having 3 to 6 carbon atoms (such as a cyclopentyl group and a cyclohexyl group).

In the above-described general formula (A), in the monovalent hydrocarbon group represented by $R^a$, an example of the aromatic hydrocarbon group includes an aryl group having 6 to 10 carbon atoms (such as a phenyl group and a naphthyl group).

In the above-described general formula (A), $R^a$s may be the same or different from each other. Preferably, $R^a$s are the same.

As the monovalent hydrocarbon group, preferably, an alkyl group having 1 to 6 carbon atoms and an aryl group having 6 to 10 carbon atoms are used, or more preferably, a methyl group and a phenyl group are used.

In the above-described general formula (A), "n" is preferably an integer of 10,000 or less, or more preferably an integer of 1,000 or less.

"n" in the above-described general formula (A) is calculated as an average value.

To be specific, examples of the polysiloxane containing silanol groups at both ends include a polydimethylsiloxane containing silanol groups at both ends, a polymethylphenylsiloxane containing silanol groups at both ends, and a polydiphenylsiloxane containing silanol groups at both ends.

These first polysiloxanes can be used alone or in combination of a plurality of different types.

Of the first polysiloxanes, preferably, a polydimethylsiloxane containing silanol groups at both ends is used.

A commercially available product can be used as the first polysiloxane. A first polysiloxane synthesized in accordance with a known method can be also used.

The number average molecular weight of the first polysiloxane is, for example, 100 or more, or preferably 200 or more, and is, for example, 1,000,000 or less, or preferably 100,000 or less. The number average molecular weight is calculated by conversion based on standard polystyrene with a gel permeation chromatography.

The mixing ratio of the first polysiloxane in the silicone pressure-sensitive adhesive composition is, for example, 60 mass % or more, or preferably 80 mass % or more, and is, for example, 99.5 mass % or less, or preferably 98 mass % or less.

The second polysiloxane is an auxiliary material of the silicone pressure-sensitive adhesive composition and is added as required, for example, in order to obtain properties such as improvement in the hardness of the adhesive layer, improvement in the adhesive force, and improvement in the heat resistance. Examples of the second polysiloxane include a chain type polysiloxane and a cyclic polysiloxane. Preferably, a cyclic polysiloxane is used.

The cyclic polysiloxane is represented by the following general formula (B).

General Formula (B):

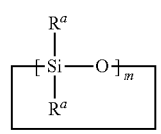

(B)

(where, in general formula (B), $R^a$ represents the same $R^a$ as that in general formula (A). "m" represents an integer of 2 or more.)

"m" is preferably an integer of 3 or more, and is, for example, an integer of 10 or less, or preferably an integer of 6 or less.

To be specific, examples of the cyclic polysiloxane include a hexamethylcyclotrisiloxane (where, in general formula (B), $R^a$ is methyl and "m" is 3), an octamethylcyclotetrasiloxane (where, in general formula (B), $R^a$ is methyl and "m" is 4), and a decamethylcyclopentasiloxane (where, in general formula (B), $R^a$ is methyl and "m" is 5).

These second polysiloxanes can be used alone or in combination of a plurality of different types.

Of the second polysiloxanes, preferably, an octamethylcyclotetrasiloxane is used.

The mixing ratio of the second polysiloxane with respect to 100 parts by mass of the first polysiloxane is, for example, 20 parts by mass or less, or preferably 10 parts by mass or less.

An example of the catalyst includes a peroxide. An example of the peroxide includes an organic peroxide such as a benzoyl peroxide including dibenzoyl peroxide, benzoyl m-methylbenzoyl peroxide, and m-toluoyl peroxide.

These catalysts can be used alone or in combination.

As the catalyst, preferably, dibenzoyl peroxide, benzoyl m-methylbenzoyl peroxide, and m-toluoyl peroxide are used in combination (a mixture).

The mixing ratio of the catalyst with respect to 100 parts by mass of the first polysiloxane is, in view of controlling the hardness of the adhesive layer, for example, 0.5 parts by mass or more, or preferably 1 part by mass or more, and is, for example, 10 parts by mass or less, or preferably 5 parts by mass or less.

The above-described material is blended in a solvent as required to prepare a varnish and subsequently, the obtained mixture is allowed to react as required, so that the silicone pressure-sensitive adhesive composition is prepared. An example of the solvent includes an aromatic hydrocarbon such as toluene.

The above-described solvent is distilled off as required after forming a film of the adhesive layer.

A commercially available product can be used as the above-described silicone pressure-sensitive adhesive composition. Examples of the commercially available product include 280A, 282, 7355, 7358, 7502, 7657, Q2-7406, Q2-7566, and Q2-7735 manufactured by Dow Corning Corporation and PSA 590, PSA 600, PSA 595, PSA 610, PSA 518, PSA 6574, PSA 529, PSA 750-D1, PSA 825-D1, and PSA 800-C manufactured by Momentive Performance Materials Inc.

The silicone pressure-sensitive adhesive composition is, for example, prepared in a liquid state or in a semi-solid state.

The silicone thermoplastic-thermosetting adhesive composition has both thermoplastic properties and thermosetting properties. Examples of the silicone thermoplastic-thermosetting adhesive composition include a first silicone thermoplastic-thermosetting adhesive composition, a second silicone thermoplastic-thermosetting adhesive composition, a third silicone thermoplastic-thermosetting adhesive composition, a fourth silicone thermoplastic-thermosetting adhesive composition, a fifth silicone thermoplastic-thermosetting adhesive composition, and a sixth silicone thermoplastic-thermosetting adhesive composition.

The first silicone thermoplastic-thermosetting adhesive composition contains, for example, a silicone resin composition containing amino groups at both ends, a diisocyanate, and a radical generator.

The silicone resin composition containing amino groups at both ends is, preferably, in view of transparency and high heat resistance, a compound represented by the following formula (1).

Formula (1):

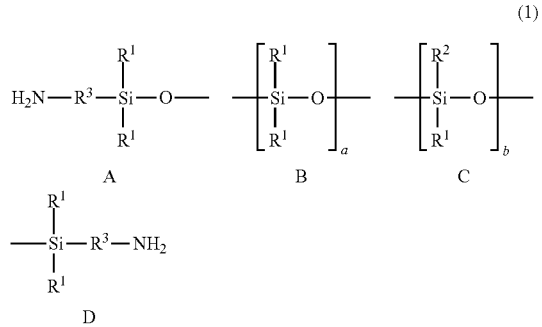

(1)

(where, in formula, A to D represent a constituent unit, A and D represent an end unit, and B and C represent a repeating unit. $R^1$ represents a monovalent hydrocarbon group, $R^2$ represents an alkenyl group, and $R^3$ represents an alkylene group. "a" represents an integer of 0 or more and "b" represents an integer of 0 or more. "a+b" satisfies the relationship of being an integer of at least 1 or more. All of the $R^1$s may be the same or different from each other and "b" pieces of $R^2$ may be the same or different from each other.)

The compound represented by formula (1) consists of the constituent units A, B, C, and D and is a compound containing an amino group ($-NH_2$) in its end unit.

The hydrocarbon group represented by $R^1$ in formula (1) is, for example, a saturated hydrocarbon group or an aromatic hydrocarbon group. The number of carbon atoms in the hydrocarbon group is, in view of availability, for example, 1 to 20, or preferably 1 to 10.

An example of the saturated hydrocarbon group includes an alkyl group such as methyl, ethyl, propyl, butyl, pentyl, hexyl, cyclohexyl, and cyclopentyl. An example of the aromatic hydrocarbon group includes an aryl group such as phenyl, benzyl, and tolyl.

Of the hydrocarbon groups represented by $R^1$, in view of transparency and light resistance of the obtained first silicone thermoplastic-thermosetting adhesive composition, preferably, methyl and phenyl are used, or more preferably, methyl is used. In formula (1), preferably, all of the $R^1$s are independent respectively, regardless of the constituent unit, and represent the above-described hydrocarbon group.

Examples of $R^2$ in formula (1) include a substituted or unsubstituted alkenyl group. To be specific, an organic group containing an alkenyl group in the skeleton is used. Examples thereof include vinyl, allyl, butynyl, pentynyl, and hexynyl. Among all, in view of transparency and heat resistance of the obtained first silicone thermoplastic-thermosetting adhesive composition, preferably, vinyl is used.

Examples of $R^3$ in formula (1) include a substituted or unsubstituted alkylene group. To be specific, an organic group containing an alkylene group in the skeleton is used. The number of carbon atoms in the organic group is, in view of transparency and heat resistance of the obtained first silicone thermoplastic-thermosetting adhesive composition, for example, 1 to 10. To be specific, examples thereof include methylene, ethylene, propylene, butylene, pentylene, hexylene, and heptylene. Among all, in view of transparency and heat resistance of the obtained first silicone thermoplastic-thermosetting adhesive composition, preferably, propylene is used. In formula (1), all of the $R^3$s, that is, two $R^3$s may be the same or different from each other.

The constituent unit A is an end unit and to be specific, is contained in one end of a molecule. That is, one constituent unit A is contained in formula (1).

The constituent unit D is an end unit and to be specific, is contained in the other end of the molecule, which is the opposite side of the constituent unit A. That is, one constituent unit D is contained in formula (1).

The repeating unit number of the constituent unit B, that is, "a" in formula (1) represents an integer of 0 or more and is, in view of transparency of the obtained first silicone thermoplastic-thermosetting adhesive composition, for example, an integer of 1 to 10,000, or preferably an integer of 10 to 10,000.

The repeating unit number of the constituent unit C, that is, "b" in formula (1) is, in view of transparency of the obtained first silicone thermoplastic-thermosetting adhesive composition, for example, an integer of 0 to 10,000, or preferably an integer of 0 to 1,000.

The sum of "a" and "b" is preferably 1 to 10,000, or more preferably 10 to 10,000. The sum of "a" and "b" is an integer of at least 1 or more and thus, either "a" or "b" may be 0.

A commercially available product can be used as the silicone resin composition containing amino groups at both ends represented by formula (1). The silicone resin composition containing amino groups at both ends can be also synthesized in accordance with a known method.

The weight average molecular weight of the silicone resin composition containing amino groups at both ends represented by formula (1) is, in view of stability and handling ability, for example, 100 to 1,000,000, or preferably 1,000 to 100,000. The weight average molecular weight is measured with a gel permeation chromatography (GPC: calibrated with standard polystyrene equivalent) and the same applies hereinafter.

The content of the silicone resin composition containing amino groups at both ends in the first silicone thermoplastic-thermosetting adhesive composition is, for example, 1 mass % or more, or preferably 80 mass % or more, and is, for example, 99.9 mass % or less.

The diisocyanate is, in view of compatibility with each of the components, for example, represented by the following formula (2).

Formula (2):

(where, in formula, Y represents a divalent hydrocarbon group.)

Examples of Y in formula (2) include a saturated or unsaturated straight chain, branched chain, or cyclic hydrocarbon group. The number of carbon atoms in the hydrocarbon group is, in view of availability and heat resistance of the obtained first silicone thermoplastic-thermosetting adhesive composition, for example, 1 to 50, or preferably 1 to 30.

Examples of the diisocyanate include an aliphatic diisocyanate, an aromatic diisocyanate, an alicyclic diisocyanate, or modified forms thereof. To be specific, examples of the diisocyanate include hexamethylene diisocyanate, 4,4'-methylene dicyclohexylene diisocyanate, 4,4'-methylene diphenylene diisocyanate, 1,3-diazetidine-2,4-dione-bis(4,4'-methylene dicyclohexyl)diisocyanate, 1,3-diazetidine-2,4-dione-bis(4,4-methylene diphenyl)diisocyanate, tetramethylene xylylene diisocyanate, isophorone diisocyanate, tolylene2,4-diisocyanate, and dicyclohexylmethylene diisocyanate. These can be used alone or in combination of two or more. Of these, in view of transparency, heat resistance, and availability, preferably, tolylene2,4-diisocyanate, isophorone diisocyanate, and hexamethylene diisocyanate are used.

A commercially available product can be used as the diisocyanate. The diisocyanate can be also synthesized in accordance with a known method.

The content of the diisocyanate in the first silicone thermoplastic-thermosetting adhesive composition is, for example, $1.0 \times 10^{-5}$ mass % or more, and is, for example, 20 mass % or less, or preferably 10 mass % or less.

In the mass ratio of the silicone resin composition containing amino groups at both ends to the diisocyanate, in view of allowing the amino group in the silicone resin composition containing amino groups at both ends to react with the isocyanate group in the diisocyanate neither too much nor too little, the molar ratio (the amino group/the isocyanate group) of the functional groups is, for example, 0.1/1 to 1/0.1, or preferably substantially equal in amount (1/1).

The radical generator is a compound that generates a radical and accelerates a cross-linking reaction among the silicone resin compositions containing amino groups at both ends with themselves. Examples thereof include a photo radical generator and an organic peroxide. The first silicone thermoplastic-thermosetting adhesive composition shows thermoplastic properties/thermosetting properties in accordance with the temperature. Thus, preferably, an organic peroxide that generates a radical by heating is used.

To be specific, examples of the radical generator include methyl ethyl ketone peroxide, cyclohexanone peroxide, methylcyclohexanone peroxide, acetylacetone peroxide, 1,1-di(t-hexylperoxy)-3,3,5-trimethylcyclohexane, 1,1-di(t-hexylperoxy)cyclohexane, 1,1-di(t-butylperoxy)-2-methylcyclohexane, 1,1-di(t-butylperoxy)cyclohexane, 2,2-di(t-butylperoxy)butane, 2,2-di(4,4-di-(butylperoxy)cyclohexyl)propane, p-menthane hydroperoxide, diisopropylbenzene hydroperoxide, 1,1,3,3-tetramethylbutyl hydroperoxide, cumene hydroperoxide, t-butyl hydroperoxide, dicumyl peroxide, 2,5-dimethyl-2,5-di(t-butylperoxy)hexane, t-butylcumyl peroxide, di-t-hexyl peroxide, di-t-butyl peroxide, diisobutyryl peroxide, di-n-octanoyl peroxide, dibenzoyl peroxide, di-n-propyl peroxydicarbonate, diisopropyl peroxydicarbonate, di(4-t-butylcyclohexyl)peroxycarbonate, t-hexyl peroxyneodecanoate, t-butyl peroxyneodecanoate, t-butyl peroxydiisobutyrate, t-butyl peroxyallylmonocarbonate, and t-butyl peroxybenzene. These can be used alone or in combination of two or more. Of these, in view of transparency, heat resistance, and availability, preferably, di-t-butyl peroxide, 2,5-dimethyl-2,5-di(t-butylperoxy)hexane, and t-butyl peroxybenzene are used.

The temperature at which these radical generators generate a radical is not unconditionally determined and is, for example, 100° C. or more.

A commercially available product can be used as the radical generator. The radical generator can be also synthesized in accordance with a known method.

The content of the radical generator in the first silicone thermoplastic-thermosetting adhesive composition is, for example, $1.0 \times 10^{-6}$ mass % or more, and is, for example, 20 mass % or less, or preferably 10 mass % or less.

The content of the radical generator with respect to 100 mol % of $R^1$ group amount in the silicone resin composition containing amino groups at both ends is, in view of maintaining flexibility of the obtained first silicone thermoplastic-thermosetting adhesive composition, for example, 0.001 mol % or more, or preferably 0.01 mol % or more, and is, for example, 50 mol % or less, or preferably 10 mol % or less.

The first silicone thermoplastic-thermosetting adhesive composition can be prepared without any particular limitation as long as it contains the silicone resin composition containing amino groups at both ends, the diisocyanate, and the radical generator.

In the first silicone thermoplastic-thermosetting adhesive composition, the reaction temperature and the duration are appropriately selected in accordance with the respective reaction mechanism of the reaction of the isocyanate group and the cross-linking reaction by the radical generator to progress and terminate the reactions. In this way, preferably, components related to the reaction of the isocyanate group, that is, the silicone resin composition containing amino groups at both ends and the diisocyanate are mixed in advance and then, the radical generator is blended thereto.

The mixing of the components related to the reaction of the isocyanate group is performed by stirring the silicone resin composition containing amino groups at both ends and the diisocyanate, and an additive such as an organic solvent as required at, for example, 0° C. or more, or preferably 10° C. or more, and at, for example, 100° C. or less, or preferably 60° C. or less for, for example, 0.1 to 40 hours.

The organic solvent is not particularly limited and in view of improving compatibility of each of the components, preferably, ketone such as methyl ethyl ketone is used.

By the above-described mixing, a part of the reaction of the amino group in the silicone resin composition containing amino groups at both ends with the isocyanate group in the diisocyanate may start. The degree of progress of the reaction can be checked by $^1$H-NMR measurement based on the degree of disappearance of the peak derived from the amino group.

Next, as a component related to the cross-linking reaction, the radical generator is mixed in a mixture of the components related to the reaction of the isocyanate group described above. In the first silicone thermoplastic-thermosetting adhesive composition, a cured product (a formed product) can be obtained by the occurrence of the cross-linking reaction on obtaining the cured product by performing two types of the reactions, that is, the reaction of the isocyanate group and the cross-linking reaction by the radical generator. Thus, the mixing method is not particularly limited as long as the radical generator is uniformly mixed into the mixture of the components related to the reaction of the isocyanate group described above.

To be specific, the radical generator is blended into the mixture of the silicone resin composition containing amino groups at both ends and the diisocyanate to be stirred and mixed. The mixing duration is not unconditionally determined in accordance with the reaction temperature and the type and amount of the component subjected to the reaction and is, for example, 0.1 to 40 hours. In the obtained mixture (the reacting product), a solvent or the like can be removed in accordance with a known method.

The first silicone thermoplastic-thermosetting adhesive composition obtained in this way is solid at a normal temperature, shows a thermoplastic behavior at 40° C. or more, and furthermore, shows the thermosetting properties at 50° C. or more.

To be specific, the thermoplastic temperature of the first silicone thermoplastic-thermosetting adhesive composition is preferably 40° C. or more, or more preferably 80° C. or more, and is, preferably 200° C. or less, or more preferably 150° C. or less. The thermoplastic temperature is the temperature at which the first silicone thermoplastic-thermosetting adhesive composition shows the thermoplastic properties. To be specific, the thermoplastic temperature is the temperature at which the first silicone thermoplastic-thermosetting adhesive composition in a solid state is softened by heating to be brought into a completely liquid state and is substantially the same as the softening temperature.

The thermosetting temperature of the first silicone thermoplastic-thermosetting adhesive composition is preferably 100° C. or more, or more preferably 130° C. or more, and is preferably 200° C. or less. The thermosetting temperature is the temperature at which the first silicone thermoplastic-thermosetting adhesive composition shows the thermosetting properties. To be specific, the thermosetting temperature is the temperature at which the first silicone thermoplastic-thermosetting adhesive composition in a liquid state is cured by heating to be brought into a completely solid state.

The second silicone thermoplastic-thermosetting adhesive composition contains, for example, a silicone resin composition containing amino groups at both ends, an organohydrogenpolysiloxane, a diisocyanate, and a hydrosilylation catalyst.

An example of the silicone resin composition containing amino groups at both ends in the second silicone thermoplastic-thermosetting adhesive composition includes the same silicone resin composition containing amino groups at both ends as that illustrated in the first silicone thermoplastic-thermosetting adhesive composition.

The content of the silicone resin composition containing amino groups at both ends in the second silicone thermoplastic-thermosetting adhesive composition is, for example, 1 to 99.5 mass %, or preferably 80 to 99.5 mass %.

The organohydrogenpolysiloxane is a polysiloxane containing a hydrosilyl group (—SiH). To be more specific, the organohydrogenpolysiloxane is in a straight chain and an example thereof includes a side-chain type organohydrogenpolysiloxane, which contains a hydrosilyl group in its side chain bonded to the main chain, and/or a dual-end type organohydrogenpolysiloxane, which contains hydrosilyl groups at both ends of a molecule.

The side-chain type organohydrogenpolysiloxane is, for example, represented by the following formula (3).

Formula (3):

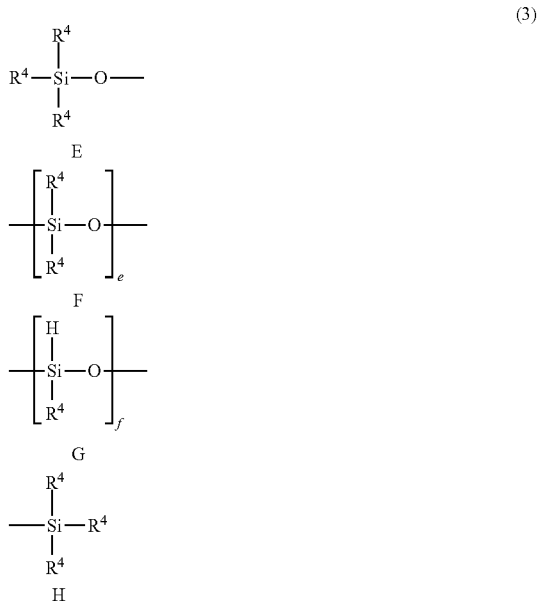

(where, in formula, E to H represent a constituent unit, E and H represent an end unit, and F and G represent a repeating unit. $R^4$ represents a monovalent hydrocarbon group. "e" represents an integer of 0 or more and "f" represents an integer of 1 or more.)

E to H constitute the side-chain type organohydrogenpolysiloxane.

The monovalent hydrocarbon groups represented by $R^4$ in formula (3) may be the same or different from each other. Preferably, the monovalent hydrocarbon groups represented by $R^4$ are the same.

An example of the monovalent hydrocarbon group represented by $R^4$ includes the same monovalent hydrocarbon group as that represented by $R^1$ in the above-described formulas (1) and (2). Preferably, methyl and phenyl are used, or more preferably, methyl is used.

"e" represents, in view of reactivity and stability, preferably an integer of 1 to 10000, or more preferably an integer of 1 to 5000.

"f" represents preferably an integer of 2 or more, and also represents, in view of reactivity and stability, preferably an integer of 1 to 10000, or more preferably an integer of 1 to 1000. "f" represents, in view of imparting flexibility to the silicone resin composition while obtaining it in a solid state at a room temperature, particularly preferably an integer larger than "e", or most preferably an integer of 100 to 1000.

Examples of the side-chain type organohydrogenpolysiloxane include methylhydrogensiloxane, dimethylsiloxane-co-methylhydrogensiloxane, ethylhydrogensiloxane, and methylhydrogensiloxane-co-methylphenylsiloxane.

The number average molecular weight of the side-chain type organohydrogenpolysiloxane is, in view of stability and handling ability, for example, 200 to 100000, or preferably 200 to 80000.

The side-chain type organohydrogenpolysiloxane can be, for example, synthesized in accordance with a known method. A commercially available product (for example, manufactured by Gelest, Inc., and Shin-Etsu Chemical Co., Ltd.) can be also used.

The dual-end type organohydrogenpolysiloxane is, for example, represented by the following formula (4).

Formula (4):

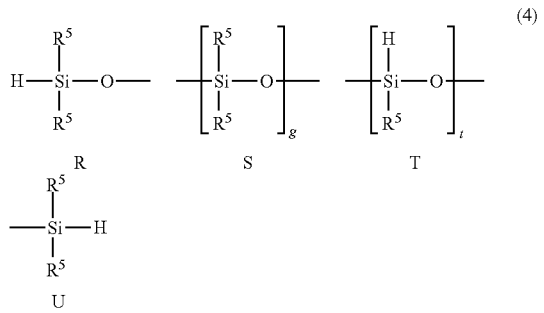

(where, in formula, R to U represent a constituent unit, R and U represent an end unit, and S and T represent a repeating unit. $R^5$ represents a monovalent hydrocarbon group selected from a saturated hydrocarbon group and an aromatic hydrocarbon group. "g" represents an integer of 0 or more and "t" represents an integer of 0 or more.)

R to U constitute the dual-end type organohydrogenpolysiloxane.

The monovalent hydrocarbon groups represented by $R^5$ in formula (4) may be the same or different from each other. Preferably, the monovalent hydrocarbon groups represented by $R^5$ are the same.

An example of the monovalent hydrocarbon group represented by $R^5$ includes the same monovalent hydrocarbon group as that represented by $R^1$ in the above-described formula (1). As the monovalent hydrocarbon group represented by $R^5$, preferably, a methyl group and a phenyl group are used, or more preferably, a methyl group is used.

"g" represents, in view of reactivity and stability, preferably an integer of 0 or more, more preferably an integer of 1 to 10000, or particularly preferably an integer of 1 to 5000.

"t" represents, in view of reactivity and stability, preferably an integer of 0 or more, more preferably an integer of 1 to 10000, or particularly preferably an integer of 1 to 5000.

The dual-end type organohydrogenpolysiloxane is, for example, when "t" is 1 or more, an organopolysiloxane containing both a hydrogen atom in its side chain and hydrogen atoms at both ends, which contains a hydrogen atom in the side chain branched off from the main chain and hydrogen atoms at both ends of the main chain. To be specific, examples thereof include a methylhydrogenpolysiloxane containing hydrosilyl groups at both ends, a (dimethylpolysiloxane-co-methylhydrogenpolysiloxane) containing hydrosilyl groups at both ends, an ethylhydrogenpolysiloxane containing hydrosilyl groups at both ends, and a (methylhydrogenpolysiloxane-co-methylphenylpolysiloxane) containing hydrosilyl groups at both ends.

The dual-end type organohydrogenpolysiloxane is, for example, when "t" is 0, an organopolysiloxane containing no hydrogen atom in its side chain/containing hydrogen atoms at both ends, which does not contain a hydrogen atom in the side chain branched off from the main chain and contains hydrogen atoms at both ends of the main chain. To be specific, examples thereof include a polydimethylsiloxane containing hydrosilyl groups at both ends, a polymethylphenylsiloxane containing hydrosilyl groups at both ends, and a polydiphenylsiloxane containing hydrosilyl groups at both ends.

As the dual-end type organohydrogenpolysiloxane, preferably, an organopolysiloxane containing no hydrogen atom in its side chain/containing hydrogen atoms at both ends represented by formula (5) is used.

Formula (5):

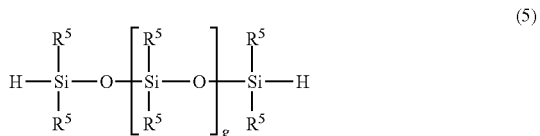

(where, in formula, $R^5$ represents a monovalent hydrocarbon group selected from a saturated hydrocarbon group and an aromatic hydrocarbon group. "g" represents an integer of 1 or more.)

The monovalent hydrocarbon groups represented by $R^5$ in formula (5) may be the same or different from each other. Preferably, the monovalent hydrocarbon groups represented by $R^5$ are the same.

In formula (5), $R^5$ is the same as that in the description above and "g" is the same as that in the description above.

The number average molecular weight of the dual-end type organohydrogenpolysiloxane is, in view of stability and handling ability, for example, 100 to 30000, or preferably 100 to 10000.

The dual-end type organohydrogenpolysiloxane can be, for example, synthesized in accordance with a known method. A commercially available product can be also used.

To be specific, the content of the hydrosilyl group in the organohydrogenpolysiloxane is, for example, 0.01 mmol/g or more, or preferably 0.05 mmol/g or more, and is, for example, 20 mmol/g or less, or preferably 15 mmol/g or less. The content of the hydrosilyl group is calculated from the integral value of the hydrosilyl group and the methyl group with a $^1$H-NMR.

The organohydrogenpolysiloxane can be, for example, synthesized in accordance with a known method. A commercially available product (for example, manufactured by Gelest, Inc., and Shin-Etsu Chemical Co., Ltd.) can be also used.

The content of the organohydrogenpolysiloxane in the second silicone thermoplastic-thermosetting adhesive composition is, for example, 0.0001 mass % or more, or preferably 0.001 mass % or more, and is, for example, 90 mass % or less, or preferably 50 mass % or less.

In the mass ratio of the silicone resin composition containing amino groups at both ends to the organohydrogenpolysiloxane, in view of allowing the alkenyl group in the silicone resin composition containing amino groups at both ends to react with the SiH group (the hydrosilyl group) in the organohydrogenpolysiloxane neither too much nor too little, the molar ratio (the alkenyl group/the SiH group) of the functional groups is, for example, 1/1 to 0.1/1, preferably 1/1 to 0.2/1, more preferably 1/1 to 0.5/1, or particularly preferably substantially equal in amount (1/1).

An example of the diisocyanate includes the same diisocyanate as that illustrated in the first silicone thermoplastic-thermosetting adhesive composition.

The content of the diisocyanate in the second silicone thermoplastic-thermosetting adhesive composition is, for example, $1.0 \times 10^{-5}$ mass % or more, and is, for example, 20 mass % or less, or preferably 10 mass % or less.

In the mass ratio of the silicone resin composition containing amino groups at both ends to the diisocyanate, in view of allowing the amino group in the silicone resin composition containing amino groups at both ends to react with the isocyanate group in the diisocyanate neither too much nor too little, the molar ratio (the amino group/the isocyanate group) of the functional groups is, for example, 1/1 to 0.1/1, preferably 1/1 to 0.2/1, more preferably 1/1 to 0.5/1, or particularly preferably substantially equal in amount (1/1).

The hydrosilylation catalyst is not particularly limited as long as it is a compound that catalyzes the hydrosilylation reaction of the alkenyl group in the silicone resin composition containing amino groups at both ends with the hydrosilyl group in the organohydrogenpolysiloxane. Examples of the hydrosilylation catalyst include a platinum catalyst such as platinum black, platinum chloride, chloroplatinic acid, a platinum olefin complex, a platinum carbonyl complex, and platinum acetyl acetate; a palladium catalyst; and a rhodium catalyst.

In the content of the hydrosilylation catalyst in the second silicone thermoplastic-thermosetting adhesive composition, for example, when the platinum catalyst is used, in view of reaction rate, the content of the platinum with respect to 100 parts by mass of the organohydrogenpolysiloxane is, for example, $1.0 \times 10^{-10}$ parts by mass or more, or preferably $1.0 \times 10^{-8}$ parts by mass or more, and is, for example, 0.5 parts by mass or less, or preferably $1.0 \times 10^{-3}$ parts by mass or less.

The second silicone thermoplastic-thermosetting adhesive composition can be prepared without any particular limitation as long as it contains each of the components of the silicone resin composition containing amino groups at both ends, the organohydrogenpolysiloxane, the diisocyanate, and the hydrosilylation catalyst.

In the second silicone thermoplastic-thermosetting adhesive composition, the reaction temperature and the duration are appropriately selected in accordance with the respective reaction mechanism of the reaction of the isocyanate group and the hydrosilylation reaction to progress and terminate the reactions. In this way, components related to the reaction of the isocyanate group are mixed in advance and then, the components related to the hydrosilylation reaction may be mixed thereto.

The mixing of the components related to the reaction of the isocyanate group can be performed by stirring the silicone resin composition containing amino groups at both ends and the diisocyanate, and an additive such as an organic solvent as required at, for example, 0° C. or more, or preferably 10° C. or more, and at, for example, 100° C. or less, or preferably 60° C. or less for, for example, 0.1 to 40 hours.

The organic solvent is not particularly limited and in view of improving compatibility of each of the components, preferably, ketone such as methyl ethyl ketone is used.

By the above-described mixing, a part of the reaction of the amino group in the silicone resin composition containing amino groups at both ends with the isocyanate group in the diisocyanate may start. The degree of progress of the reaction can be checked by $^1$H-NMR measurement based on the degree of disappearance of the peak derived from the amino group.

Thereafter, as components related to the hydrosilylation reaction, the organohydrogenpolysiloxane and the hydrosilylation catalyst are blended into a mixture of the components related to the reaction of the isocyanate group described above.

In the second silicone thermoplastic-thermosetting adhesive composition, by the subsequent heating, a cured product (a formed product) can be obtained by the occurrence of the above-described hydrosilylation reaction. Thus, the mixing method is not particularly limited as long as the components related to the hydrosilylation reaction are uniformly mixed into the mixture of the components related to the reaction of the isocyanate group described above.

To be specific, the organohydrogenpolysiloxane and the hydrosilylation catalyst are blended into the mixture of the silicone resin composition containing amino groups at both ends and the diisocyanate to be stirred and mixed. The mixing duration is not unconditionally determined in accordance with the reaction temperature and the type and amount of the component subjected to the reaction and is, for example, 0.1 to 40 hours. The mixing method is not particularly limited as long as each of the components is uniformly mixed. In the obtained mixture, a solvent or the like can be removed in accordance with a known method.

The second silicone thermoplastic-thermosetting adhesive composition obtained in this way is solid at a normal temperature, shows a thermoplastic behavior at 40° C. or more, and furthermore, shows the thermosetting properties at 50° C. or more.

To be specific, the thermoplastic temperature of the second silicone thermoplastic-thermosetting adhesive composition is, for example, 40 to 200° C., or preferably 40 to 150° C.

In the following thermosetting temperature, in the second silicone thermoplastic-thermosetting adhesive composition, the hydrosilylation reaction is progressed and the second silicone thermoplastic-thermosetting adhesive composition is cured by heating.

The thermosetting temperature is, for example, 100 to 200° C., or preferably 130 to 200° C. The degree of progress of the hydrosilylation reaction can be checked by $^1$H-NMR measurement based on the intensity of a signal derived from the amino group in the silicone resin composition containing amino groups at both ends. The reaction is considered to be terminated at the time of disappearance of the signal.

The third silicone thermoplastic-thermosetting adhesive composition is obtained by allowing a cage octasilsesquioxane to react with an alkenyl group-containing polysiloxane in the presence of a hydrosilylation catalyst.

The cage octasilsesquioxane is an octamer of trifunctional silicone monomer and to be specific, has eight groups represented by the following formula (6), Formula (6):

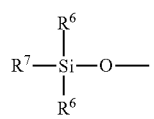

(6)

(where, in formula, $R^6$ represents a monovalent hydrocarbon group and $R^7$ represents hydrogen or a monovalent hydrocarbon group. The molar ratio of the monovalent hydrocarbon group: hydrogen in $R^7$ in the cage octasilsesquioxane as a whole is, as an average value, in the range of 6.5:1.5 to 5.5:2.5.)

To be more specific, the cage octasilsesquioxane is represented by the following formula (7).

Formula (7):

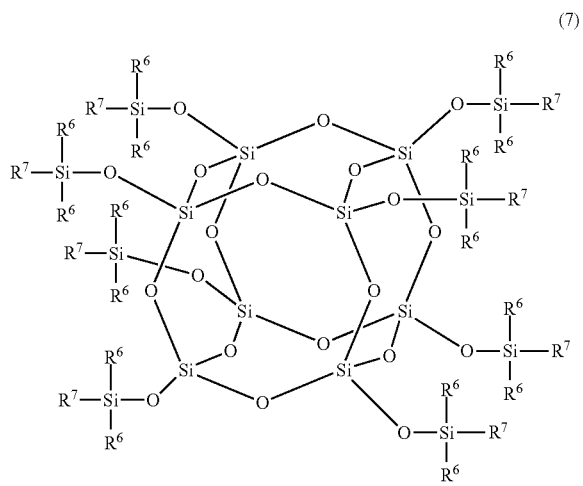

(7)

(where, in formula, $R^6$ and $R^7$ are the same as those in the description above. The molar ratio of the monovalent hydrocarbon group: hydrogen in $R^7$ is the same as that in the description above.)

An example of the monovalent hydrocarbon group represented by $R^6$ in the above-described formulas (6) and (7) includes a saturated hydrocarbon group or an aromatic hydrocarbon group.

Examples of the saturated hydrocarbon group include a straight chain saturated hydrocarbon group (for example, an alkyl group having 1 to 6 carbon atoms such as methyl, ethyl, propyl, butyl, pentyl, and hexyl), a branched chain saturated hydrocarbon group (for example, an alkyl group having 3 to 6 carbon atoms such as isopropyl and isobutyl), and a cyclic saturated hydrocarbon group (for example, a cycloalkyl group having 3 to 6 carbon atoms such as cyclohexyl).

An example of the aromatic hydrocarbon group includes an aryl group having 6 to 8 carbon atoms such as phenyl, benzyl, and tolyl.

The number of carbon atoms of the monovalent hydrocarbon group is, for example, 1 to 8, or preferably 1 to 6.

$R^6$s may be the same or different from each other. Preferably, $R^6$s are the same.

As the monovalent hydrocarbon group, preferably, in view of easy preparation and thermal stability, a saturated and straight chain hydrocarbon group is used, more preferably, an alkyl group having 1 to 6 carbon atoms is used, or particularly preferably, methyl is used.

An example of the monovalent hydrocarbon group represented by $R^7$ in the above-described formulas (6) and (7) includes the same monovalent hydrocarbon group as that represented by $R^1$ described above. Preferably, methyl is used.

The molar ratio of the monovalent hydrocarbon group: hydrogen in $R^7$ in formula (7), in the cage octasilsesquioxane as a whole, is in the range of 6.5:1.5 to 5.5:2.5, or preferably 6.0:2.0 to 5.5:2.5 as an average value.

That is, in one molecule of the cage octasilsesquioxane, the group represented by the above-described formula (6) forms 1.5 to 2.5 (to be specific, two), or preferably 2 to 2.5 (to be specific, two) of the hydrosilyl groups (—SiH).

When the above-described molar ratio of the monovalent hydrocarbon group: hydrogen in $R^7$ exceeds 6.5/1.5 (=6.5:1.5) (for example, 7/1 (=7:1)), the number of moles of the hydrosilyl group is excessively small and thus, the reactivity of the cage octasilsesquioxane with respect to the alkenyl group-containing polysiloxane is excessively reduced. Thus, there may be a case where the molecular weight of the third silicone thermoplastic-thermosetting adhesive composition to be obtained is reduced and a solid silicone thermoplastic-thermosetting adhesive composition is not capable of being obtained.

On the other hand, when the above-described molar ratio of the monovalent hydrocarbon group: hydrogen in $R^7$ is below 5.5/2.5 (=5.5:2.5) (for example, 5/3 (=5:3)), the number of moles of the hydrosilyl group in the cage octasilsesquioxane is excessively large and thus, the reactivity of the cage octasilsesquioxane with respect to the alkenyl group-containing polysiloxane excessively increases. Thus, the third silicone thermoplastic-thermosetting adhesive composition may not show the thermoplastic properties.

To be specific, examples of the above-described cage octasilsesquioxane include a cage octasilsesquioxane having methyl in $R^6$ and methyl or hydrogen in $R^7$ in the above-described formulas (6) and (7) and having a molar ratio of methyl: hydrogen in $R^7$ in the cage octasilsesquioxane as a whole of 5.5:2.5, 6:2, or 6.5:1.5 as an average value.

The cage octasilsesquioxane represented by the above-described formula (7) is, for example, synthesized in accordance with a known method (for example, in conformity with the description in Japanese Unexamined Patent Publication No. 2007-246880).

To be specific, tetraalkoxysilane (tetraethoxysilane and the like) is allowed to react with an alcohol such as methanol and/or with water in the presence of a catalyst to synthesize an octa (silsesquioxane) skeleton (a portion in formula (7) excluding the groups of formula (6)) and thereafter, dialkylchlorosilane (dimethylchlorosilane and the like) and trialkylchlorosilane (trimethylchlorosilane and the like) are blended at a mixing proportion corresponding to the above-described molar ratio of the monovalent hydrocarbon group: hydrogen in $R^7$. Then, an alkoxyl group (ethoxy and the like) bonded to the silicon atom of the octa (silsesquioxane) skeleton is allowed to react with dialkylchlorosilane and trialkylchlorosilane. After the reaction, the reacting product is refined as required. In this way, the cage octasilsesquioxane can be obtained.

A commercially available product can be also used as the cage octasilsesquioxane.

The alkenyl group-containing polysiloxane is a polysiloxane containing alkenyl groups at both ends that contains alkenyl groups at both ends of a molecule.

To be specific, the alkenyl group-containing polysiloxane is represented by the following formula (8).

Formula (8):

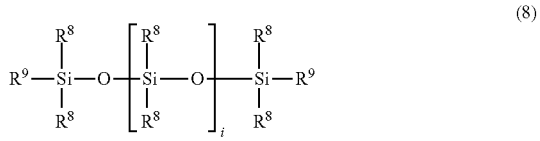

(8)

(where, in formula, $R^8$ represents a monovalent hydrocarbon group and $R^9$ represents an alkenyl group. "i" represents an integer of 1 or more.)

The monovalent hydrocarbon groups represented by $R^8$ in formula (8) may be the same or different from each other. Preferably, the monovalent hydrocarbon groups represented by $R^8$ are the same.

An example of the monovalent hydrocarbon group represented by $R^8$ includes the same monovalent hydrocarbon group as that represented by $R^6$ in the above-described formulas (6) and (7). Preferably, methyl and phenyl are used, or more preferably, methyl is used.

Examples of the alkenyl group represented by $R^9$ in formula (8) include a substituted or unsubstituted alkenyl group. Preferably, an unsubstituted alkenyl group is used.

An example of the alkenyl group includes an alkenyl group having 2 to 10 carbon atoms such as vinyl, allyl, propenyl, butenyl, and pentenyl.

The number of carbon atoms of the alkenyl group is, for example, 2 to 10, or preferably 2 to 5.

$R^9$s may be the same or different from each other. Preferably, $R^9$s are the same.

As the alkenyl group, preferably, in view of reactivity with the hydrosilyl group in the cage octasilsesquioxane, an alkenyl group having 2 to 5 carbon atoms is used, or more preferably, vinyl is used.

"i" represents, in view of reactivity and stability, preferably an integer of 1 to 5000, or more preferably an integer of 1 to 1000.

The number average molecular weight of the alkenyl group-containing polysiloxane represented by the above-described formula (8) is, in view of safety and handling ability, for example, 100 or more, or preferably 300 or more, and is, for example, 10000 or less, or preferably 5000 or less.

The alkenyl group-containing polysiloxane represented by the above-described formula (8) can be, for example, synthesized in accordance with a known method. A commercially available product (for example, manufactured by Gelest, Inc.) can be also used.

An example of the hydrosilylation catalyst includes the same hydrosilylation catalyst as that illustrated in the second silicone thermoplastic-thermosetting adhesive composition. As the hydrosilylation catalyst, preferably, in view of compatibility and transparency, a platinum catalyst is used, or more preferably, a platinum olefin complex is used. To be specific, a platinum-divinylsiloxane complex such as a platinum-1,3-divinyl-1,1,3,3-tetramethyldisiloxane complex is used.

The hydrosilylation catalyst may be prepared as a solution in a known solvent (such as toluene).

The mixing ratio of the hydrosilylation catalyst (solid content) with respect to 100 parts by mass of the total amount of the cage octasilsesquioxane and the alkenyl group-containing polysiloxane is, for example, $1.0\times10^{-10}$ parts by mass or more, or preferably $1.0\times10^{-8}$ parts by mass or more, and is, for example, 3 parts by mass or less, or preferably 1 part by mass or less.

The cage octasilsesquioxane is allowed to react with the alkenyl group-containing polysiloxane in the presence of the hydrosilylation catalyst so that the number of moles of the hydrosilyl group in the cage octasilsesquioxane is larger (excessive) than that of the alkenyl group in the alkenyl group-containing polysiloxane.

The molar ratio (the number of moles of the alkenyl group/ the number of moles of the hydrosilyl group) of the alkenyl group to the hydrosilyl group is less than 1, for example, 0.10 to 0.99, preferably 0.20 to 0.99, or more preferably 0.50 to 0.99.

On the other hand, when the above-described molar ratio exceeds the above-described range, the hydrosilyl group is fewer than the alkenyl group. In such a case, the excess of the hydrosilyl group does not remain after the reaction and the thermosetting properties may not be imparted to the third silicone thermoplastic-thermosetting adhesive composition.

In order to allow the above-described cage octasilsesquioxane to react with the above-described alkenyl group-containing polysiloxane, they are blended at the above-described mixing proportion, along with the hydrosilylation catalyst and the solvent, and thereafter, the mixture is heated as required.

Examples of the solvent include an aromatic hydrocarbon such as toluene, an aliphatic hydrocarbon such as hexane, and ester such as ethyl acetate. Preferably, in view of improving compatibility of each of the components, an aromatic hydrocarbon is used, or more preferably, toluene is used.

The reaction temperature is, for example, 0° C. or more, or preferably 20° C. or more, and is, for example, 100° C. or less, or preferably 80° C. or less and the reaction duration is, for example, 0.5 to 96 hours.

In this way, the hydrosilyl group in the cage octasilsesquioxane and the alkenyl group in the alkenyl group-containing polysiloxane are allowed to undergo the hydrosilylation reaction.

The degree of the hydrosilylation reaction can be checked by $^1$H-NMR measurement based on the intensity of a signal derived from the alkenyl group in the alkenyl group-containing polysiloxane. The hydrosilylation reaction is considered to be terminated at the time of disappearance of the signal.

In the above-described hydrosilylation reaction, the cage octasilsesquioxane is allowed to react with the alkenyl group-containing polysiloxane so that the number of moles of the hydrosilyl group is excessive compared with the number of moles of the alkenyl group. Thus, after the reaction, the excess of the hydrosilyl group remains and the excess of the hydrosilyl group is hydrolyzed with moisture in the air and undergoes a condensation reaction by the subsequent heating (for example, the heating at 100 to 200° C.). Then, the excess of the hydrosilyl group is bonded with each other (three-dimensional cross-linking) and in this way, the thermosetting properties are imparted to the third silicone thermoplastic-thermosetting adhesive composition.

In this way, the third silicone thermoplastic-thermosetting adhesive composition can be obtained.

The obtained third silicone thermoplastic-thermosetting adhesive composition is in a solid state. The third silicone thermoplastic-thermosetting adhesive composition in a solid state is obtained because the mobility of the alkenyl group-containing polysiloxane is reduced due to the steric hindrance of the cage octasilsesquioxane.

The thermoplastic temperature of the third silicone thermoplastic-thermosetting adhesive composition is, for example, 40° C. or more, or preferably 50° C. or more, and is, for example, 100° C. or less, or preferably 90° C. or less.

The thermosetting properties of the once plasticized third silicone thermoplastic-thermosetting adhesive composition are exhibited by hydrolysis and condensation reaction of the excess of the hydrosilyl group by the subsequent heating, causing the excess of the hydrosilyl group to bond with each other (three-dimensional cross-linking).

The thermosetting temperature of the third silicone thermoplastic-thermosetting adhesive composition is, for example, 150° C. or more, or preferably 180° C. or more, and is, for example, 300° C. or less, or preferably 250° C. or less.

The fourth silicone thermoplastic-thermosetting adhesive composition contains a cage octasilsesquioxane, an alkenyl group-containing polysiloxane, a hydrosilylation catalyst, and a hydroxyl group-containing polysiloxane.

Each example of the cage octasilsesquioxane, the alkenyl group-containing polysiloxane, and the hydrosilylation catalyst in the fourth silicone thermoplastic-thermosetting adhesive composition includes the same cage octasilsesquioxane as that illustrated in the third silicone thermoplastic-thermosetting adhesive composition, the same alkenyl group-containing polysiloxane as that illustrated in the third silicone thermoplastic-thermosetting adhesive composition, and the same hydrosilylation catalyst as that illustrated in the second silicone thermoplastic-thermosetting adhesive composition, respectively.

The hydroxyl group-containing polysiloxane is a polysiloxane containing a plurality (for example, two) of hydroxyl groups. To be more specific, the hydroxyl group-containing polysiloxane is a dual-end type polysiloxane containing hydroxyl groups at both ends of a molecule. To be more specific, the hydroxyl group-containing polysiloxane is represented by the following formula (9).

Formula (9):

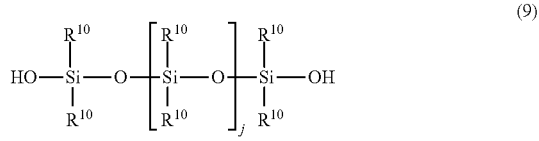

(where, in formula, $R^{10}$ represents a monovalent hydrocarbon group. "j" represents an integer of 1 or more.)

The monovalent hydrocarbon groups represented by $R^{10}$ in formula (9) may be the same or different from each other. Preferably, the monovalent hydrocarbon groups represented by $R^{10}$ are the same.

An example of the monovalent hydrocarbon group represented by $R^{10}$ includes the same monovalent hydrocarbon group as that represented by $R^6$ in the above-described formulas (5) and (6). Preferably, methyl and phenyl are used, or more preferably, methyl is used.

"j" represents, in view of reactivity and stability, preferably an integer of 1 to 10000, or more preferably an integer of 1 to 5000.

The number average molecular weight of the hydroxyl group-containing polysiloxane represented by the above-described formula (9) is, in view of safety and handling ability, for example, 100 or more, or preferably 500 or more, and is, for example, 100000 or less, or preferably 50000 or less.

The hydroxyl group-containing polysiloxane represented by the above-described formula (9) can be, for example, synthesized in accordance with a known method. A commercially available product (for example, manufactured by Gelest, Inc.) can be also used.

The cage octasilsesquioxane, the alkenyl group-containing polysiloxane, the hydrosilylation catalyst, and the hydroxyl group-containing polysiloxane are blended, so that the fourth silicone thermoplastic-thermosetting adhesive composition is prepared.

The mixing ratio of the cage octasilsesquioxane with respect to the fourth silicone thermoplastic-thermosetting adhesive composition is, for example, 1 mass % or more, or preferably 5 mass % or more, and is, for example, 50 mass % or less, or preferably 40 mass % or less.

The mixing proportion of the alkenyl group-containing polysiloxane is adjusted so that the number of moles of the alkenyl group in the alkenyl group-containing polysiloxane is smaller than that of the hydrosilyl group in the cage octasilsesquioxane.

That is, the molar ratio (the number of moles of the alkenyl group/the number of moles of the hydrosilyl group) of the alkenyl group to the hydrosilyl group is less than 1, for example, 0.10 to 0.99, preferably 0.20 to 0.99, or more preferably 0.50 to 0.99.

When the above-described molar ratio exceeds the above-described range, the hydrosilyl group is fewer than the alkenyl group. In such a case, the excess of the hydrosilyl group does not remain after the reaction and the thermosetting properties may not be imparted to the fourth silicone thermoplastic-thermosetting adhesive composition.

On the other hand, when the above-described molar ratio is below the above-described range, the hydrosilyl group excessively remains and the cage octasilsesquioxanes themselves undergo hydrolysis by moisture in the air and a self-condensation reaction to be cured, so that flexibility may not be obtained.

The mixing ratio of the hydrosilylation catalyst (solid content) with respect to 100 parts by mass of the total amount of the cage octasilsesquioxane and the alkenyl group-containing polysiloxane is, for example, $1.0 \times 10^{-10}$ parts by mass or more, or preferably $1.0 \times 10^{-8}$ parts by mass or more, and is, for example, 3 parts by mass or less, or preferably 1 part by mass or less.

The mixing ratio of the hydroxyl group-containing polysiloxane is adjusted so that the number of moles (X) of the hydroxyl group with respect to the number of moles (Y), which is obtained by subtracting the number of moles of the alkenyl group in the alkenyl group-containing polysiloxane from the number of moles of the hydrosilyl group in the cage octasilsesquioxane, as the molar ratio (X/Y), is, for example, 0.001 or more, or preferably 0.01 or more, and is, for example, 1000 or less, or preferably 100 or less. In other words, the mixing ratio of the hydroxyl group-containing polysiloxane with respect to 100 parts by mass of the total amount of the cage octasilsesquioxane and the alkenyl group-containing polysiloxane is, for example, 0.1 parts by mass or more, or preferably 1 part by mass or more, and is, for example, 50 parts by mass or less, or preferably 30 parts by mass or less.

In order to prepare the fourth silicone thermoplastic-thermosetting adhesive composition, preferably, a silicone resin composition precursor, which is obtained by allowing the cage octasilsesquioxane to react with the alkenyl group-containing polysiloxane in the presence of the hydrosilylation catalyst, and the hydroxyl group-containing polysiloxane are blended.

That is, first, the cage octasilsesquioxane is allowed to react with the alkenyl group-containing polysiloxane in the presence of the hydrosilylation catalyst so that the number of moles of the hydrosilyl group in the cage octasilsesquioxane is larger (excessive) than that of the alkenyl group in the alkenyl group-containing polysiloxane. In this way, the silicone resin composition precursor is obtained.

To be more specific, in order to obtain the silicone resin composition precursor, the above-described cage octasilsesquioxane and the above-described alkenyl group-containing polysiloxane are blended at the above-described mixing proportion, along with the hydrosilylation catalyst, and the solvent as required, and thereafter, the mixture is heated as required.

Examples of the solvent include an aromatic hydrocarbon such as toluene, an aliphatic hydrocarbon such as hexane, and ester such as ethyl acetate. Preferably, in view of improving compatibility of each of the components, an aromatic hydrocarbon is used, or more preferably, toluene is used.

The reaction temperature is, for example, 0° C. or more, or preferably 20° C. or more, and is, for example, 100° C. or less, or preferably 80° C. or less and the reaction duration is, for example, 0.5 to 96 hours.

In this way, the cage octasilsesquioxane is allowed to react with the alkenyl group-containing polysiloxane. That is, the hydrosilyl group in the cage octasilsesquioxane and the alkenyl group in the alkenyl group-containing polysiloxane are allowed to undergo the hydrosilylation reaction.

The degree of the hydrosilylation reaction of the hydrosilyl group in the cage octasilsesquioxane with the alkenyl group in the alkenyl group-containing polysiloxane can be checked by $^1$H-NMR measurement based on the intensity of a signal derived from the alkenyl group in the alkenyl group-containing polysiloxane. The hydrosilylation reaction is considered to be terminated at the time of disappearance of the signal.

In the above-described hydrosilylation reaction, the cage octasilsesquioxane is allowed to react with the alkenyl group-containing polysiloxane so that the number of moles of the hydrosilyl group is excessive compared with the number of moles of the alkenyl group. After the reaction, the excess of the hydrosilyl group remains.

In this way, the silicone resin composition precursor is obtained.

The silicone resin composition precursor is in a liquid state or in a semi-solid state.

Next, the obtained silicone resin composition precursor and hydroxyl group-containing polysiloxane are blended at the above-described proportion. By the subsequent heating, the silicone resin composition precursor is allowed to react with the hydroxyl group-containing polysiloxane. The solvent is distilled off as required.

In this way, the fourth silicone thermoplastic-thermosetting adhesive composition can be obtained.

The obtained fourth silicone thermoplastic-thermosetting adhesive composition is in a solid state. The fourth silicone thermoplastic-thermosetting adhesive composition in a solid state is obtained because the mobility of the alkenyl group-containing polysiloxane is reduced due to the steric hindrance of the cage octasilsesquioxane.

The fourth silicone thermoplastic-thermosetting adhesive composition exhibits the thermoplastic properties based on an increase in mobility of the cage octasilsesquioxane and the alkenyl group-containing polysiloxane by heating.

The thermoplastic temperature of the fourth silicone thermoplastic-thermosetting adhesive composition is, for example, 40° C. or more, or preferably 50° C. or more, and is, for example, 150° C. or less, or preferably 100° C. or less.

To be specific, the thermosetting properties of the once plasticized fourth silicone thermoplastic-thermosetting adhesive composition are exhibited by allowing the hydrosilyl group that remains in the fourth silicone thermoplastic-thermosetting adhesive composition precursor to react with the hydroxyl group in the hydroxyl group-containing polysiloxane.

To be more specific, the hydrosilyl group in the cage octasilsesquioxane in the fourth silicone thermoplastic-thermosetting adhesive composition precursor and the hydroxyl group in the hydroxyl group-containing polysiloxane are allowed to undergo the condensation reaction.

The thermosetting temperature of the fourth silicone thermoplastic-thermosetting adhesive composition is relatively low and is, for example, 100° C. or more, or preferably 120° C. or more, and is, for example, 250° C. or less. The thermosetting temperature is the temperature at which the fourth silicone thermoplastic-thermosetting adhesive composition shows the thermosetting properties. To be specific, the thermosetting temperature is the temperature at which the plasticized fourth silicone thermoplastic-thermosetting adhesive composition is cured by heating to be brought into a completely solid state.

The fourth silicone thermoplastic-thermosetting adhesive composition contains the hydroxyl group-containing polysiloxane, so that the hydroxyl group in the hydroxyl group-containing polysiloxane is allowed to react with the residual hydrosilyl group in the cage octasilsesquioxane and thus, the cage octasilsesquioxane can be cross-linked. Thus, the flexibility of the fourth silicone thermoplastic-thermosetting adhesive composition can be improved.

The fourth silicone thermoplastic-thermosetting adhesive composition can lower its thermosetting temperature (for example, 100 to 250° C.).

The fifth silicone thermoplastic-thermosetting adhesive composition contains a cage octasilsesquioxane, an alkenyl group-containing polysiloxane, a hydrosilylation catalyst, and an organohydrogenpolysiloxane.

Each example of the cage octasilsesquioxane, the alkenyl group-containing polysiloxane, and the hydrosilylation catalyst in the fifth silicone thermoplastic-thermosetting adhesive composition includes the same cage octasilsesquioxane, the same alkenyl group-containing polysiloxane, and the same hydrosilylation catalyst as those illustrated in the fourth silicone thermoplastic-thermosetting adhesive composition, respectively. The content of the hydrosilyl group in the fifth silicone thermoplastic-thermosetting adhesive composition is, for example, 0.01 mmol/g or more, or preferably 0.05 mmol/g or more, and is, for example, 20 mmol/g or less, or preferably 15 mmol/g or less.

An example of the organohydrogenpolysiloxane in the fifth silicone thermoplastic-thermosetting adhesive composition includes the same organohydrogenpolysiloxane as that illustrated in the second silicone thermoplastic-thermosetting adhesive composition.

The cage octasilsesquioxane, the alkenyl group-containing polysiloxane, the hydrosilylation catalyst, and the organohydrogenpolysiloxane are blended to prepare the fifth silicone thermoplastic-thermosetting adhesive composition.

The mixing ratio of the cage octasilsesquioxane with respect to the fifth silicone thermoplastic-thermosetting adhesive composition is, for example, 10 to 80 mass %, or preferably 10 to 70 mass %.

The mixing proportion of the alkenyl group-containing polysiloxane is adjusted so that the number of moles of the alkenyl group in the alkenyl group-containing polysiloxane is smaller than that of the hydrosilyl group in the cage octasilsesquioxane.

That is, the molar ratio (the number of moles of the alkenyl group/the number of moles of the hydrosilyl group) of the alkenyl group to the hydrosilyl group is less than 1, for example, 0.10 to 0.99, preferably 0.20 to 0.99, or more preferably 0.50 to 0.99.

When the above-described molar ratio exceeds the above-described range, the hydrosilyl group is fewer than the alkenyl group. In such a case, the excess of the hydrosilyl group does not sufficiently remain after the reaction and the thermosetting properties may not be imparted to the fifth silicone thermoplastic-thermosetting adhesive composition.

On the other hand, when the above-described molar ratio is below the above-described range, the hydrosilyl group excessively remains and the cage octasilsesquioxanes themselves undergo hydrolysis by moisture in the air and a self-condensation reaction to be cured, so that flexibility may not be obtained.

The mixing ratio of the hydrosilylation catalyst (solid content) with respect to 100 parts by mass of the total amount of the cage octasilsesquioxane and the alkenyl group-containing polysiloxane is, for example, $1.0 \times 10^{-10}$ parts by mass or more, or preferably $1.0 \times 10^{-8}$ parts by mass or more, and is, for example, 3 parts by mass or less, or preferably 1 part by mass or less.

The mixing ratio of the organohydrogenpolysiloxane is adjusted so that the number of moles (X) of the hydrosilyl group with respect to the number of moles (Y), which is obtained by subtracting the number of moles of the alkenyl group in the alkenyl group-containing polysiloxane from the number of moles of the hydrosilyl group in the cage octasilsesquioxane, as the molar ratio (X/Y), is, for example, 0.001 or more, or preferably 0.01 or more, and is, for example, 1000 or less, or preferably 100 or less. In other words, the mixing ratio of the organohydrogenpolysiloxane with respect to 100 parts by mass of the total amount of the cage octasilsesquioxane and the alkenyl group-containing polysiloxane is, for example, 0.01 to 100 parts by mass, or preferably 0.01 to 50 parts by mass.

The mixing ratio of the organohydrogenpolysiloxane with respect to the fifth silicone thermoplastic-thermosetting adhesive composition as a whole is, for example, 0.01 to 50 mass %, or preferably 0.01 to 30 mass %.

In order to prepare the fifth silicone thermoplastic-thermosetting adhesive composition, preferably, a silicone resin composition precursor, which is obtained by allowing the cage octasilsesquioxane to react with the alkenyl group-containing polysiloxane in the presence of the hydrosilylation catalyst, and the organohydrogenpolysiloxane are blended.

That is, first, the cage octasilsesquioxane is allowed to react with the alkenyl group-containing polysiloxane in the presence of the hydrosilylation catalyst at such a mixing ratio that the number of moles of the hydrosilyl group in the cage octasilsesquioxane is larger (excessive) than that of the alkenyl group in the alkenyl group-containing polysiloxane. In this way, the silicone resin composition precursor is obtained.

To be more specific, in order to obtain the silicone resin composition precursor, the above-described cage octasilsesquioxane and the above-described alkenyl group-containing polysiloxane are blended at the above-described mixing proportion, along with the hydrosilylation catalyst, and the solvent as required, and thereafter, the mixture is heated as required.

Examples of the solvent include an aromatic hydrocarbon such as toluene, an aliphatic hydrocarbon such as hexane, and ester such as ethyl acetate. Preferably, in view of improving compatibility of each of the components, an aromatic hydrocarbon is used, or more preferably, toluene is used.

The reaction temperature is, for example, 0° C. or more, or preferably 20° C. or more, and is, for example, 100° C. or less, or preferably 80° C. or less and the reaction duration is, for example, 0.5 to 96 hours.

In this way, the cage octasilsesquioxane is allowed to react with the alkenyl group-containing polysiloxane. That is, the hydrosilyl group in the cage octasilsesquioxane and the alkenyl group in the alkenyl group-containing polysiloxane are allowed to undergo the hydrosilylation reaction.

The degree of the hydrosilylation reaction of the hydrosilyl group in the cage octasilsesquioxane with the alkenyl group in the alkenyl group-containing polysiloxane can be checked by $^1$H-NMR measurement based on the intensity of a signal derived from the alkenyl group in the alkenyl group-containing polysiloxane. The hydrosilylation reaction is considered to be terminated at the time of disappearance of the signal.

In the above-described hydrosilylation reaction, the cage octasilsesquioxane is allowed to react with the alkenyl group-containing polysiloxane so that the number of moles of the hydrosilyl group is excessive compared with the number of moles of the alkenyl group. After the reaction, the excess of the hydrosilyl group remains.

In this way, the silicone resin composition precursor is obtained.

The silicone resin composition precursor is in a liquid state or in a semi-solid state.

Next, the obtained silicone resin composition precursor and organohydrogenpolysiloxane are blended at the above-described proportion. By the subsequent heating (described later), the silicone resin composition precursor is allowed to react with the organohydrogenpolysiloxane. The solvent is distilled off as required.

In this way, the fifth silicone thermoplastic-thermosetting adhesive composition can be obtained.

The obtained fifth silicone thermoplastic-thermosetting adhesive composition is in a solid state. The fifth silicone thermoplastic-thermosetting adhesive composition in a solid state is obtained because the mobility of the alkenyl group-containing polysiloxane is reduced due to the steric hindrance of the cage octasilsesquioxane.

In the fifth silicone thermoplastic-thermosetting adhesive composition, the molar ratio of the monovalent hydrocarbon group: hydrogen in $R^7$ is within a specific range and thus, in the cage octasilsesquioxane, the proportion of the hydrosilyl group to be reacted with the alkenyl group in the alkenyl group-containing polysiloxane is adjusted. Furthermore, the alkenyl group-containing polysiloxane is allowed to react with the cage octasilsesquioxane so that the alkenyl group thereof has the number of moles that is smaller than the number of moles of the hydrosilyl group in the cage octasilsesquioxane. Thus, the obtained fifth silicone thermoplastic-thermosetting adhesive composition can have both the thermoplastic and thermosetting properties, while having excellent transparency and heat resistance.

That is, the fifth silicone thermoplastic-thermosetting adhesive composition is once plasticized (or liquefied) by the above-described heating and then, is cured by heating.

The fifth silicone thermoplastic-thermosetting adhesive composition exhibits the thermoplastic properties based on an increase in mobility of the cage octasilsesquioxane and the alkenyl group-containing polysiloxane by heating.

The thermoplastic temperature of the fifth silicone thermoplastic-thermosetting adhesive composition is, for example, 40° C. or more, or preferably 50° C. or more, and is, for example, 150° C. or less, or preferably 100° C. or less. The thermoplastic temperature is the temperature at which the fifth silicone thermoplastic-thermosetting adhesive composition shows the thermoplastic properties. To be specific, the thermoplastic temperature is the temperature at which the fifth silicone thermoplastic-thermosetting adhesive composition in a solid state is softened by heating to be brought into a completely liquid state and is substantially the same as the softening temperature.

To be specific, the thermosetting properties of the once plasticized fifth silicone thermoplastic-thermosetting adhesive composition are exhibited by allowing the hydrosilyl group that remains in the silicone resin composition precursor to react with the hydrosilyl group in the organohydrogenpolysiloxane.

To be more specific, the hydrosilyl group in the cage octasilsesquioxane in the silicone resin composition precursor and the hydrosilyl group in the organohydrogenpolysiloxane are allowed to react with moisture in the air (to be hydrolyzed) and undergo a dehydration (intermolecular dehydration) condensation reaction.

The thermosetting temperature of the fifth silicone thermoplastic-thermosetting adhesive composition is relatively low and is, for example, 100° C. or more, or preferably 120° C. or more, and is, for example, 250° C. or less. The thermosetting temperature is the temperature at which the fifth silicone thermoplastic-thermosetting adhesive composition shows thermosetting properties. To be specific, the thermosetting temperature is the temperature at which the plasticized fifth silicone thermoplastic-thermosetting adhesive composition is cured by heating to be brought into a completely solid state.

In the fifth silicone thermoplastic-thermosetting adhesive composition, the hydrosilyl group in the organohydrogenpolysiloxane is allowed to react with the residual hydrosilyl group in the cage octasilsesquioxane. That is, by the dehydration (intermolecular dehydration) condensation reaction, the cage octasilsesquioxane can be cross-linked. Thus, the flexibility of the fifth silicone thermoplastic-thermosetting adhesive composition can be improved.

The fifth silicone thermoplastic-thermosetting adhesive composition can lower its thermosetting temperature (for example, 100 to 250° C.).

The sixth silicone thermoplastic-thermosetting adhesive composition contains a cage octasilsesquioxane, a polysiloxane containing alkenyl groups at both ends, a hydrosilylation catalyst, and a polysiloxane containing alkenyl groups in its side chain.

Each example of the cage octasilsesquioxane, the polysiloxane containing alkenyl groups at both ends, and the hydrosilylation catalyst in the sixth silicone thermoplastic-thermosetting adhesive composition includes the same cage octasilsesquioxane as that illustrated in the third silicone thermoplastic-thermosetting adhesive composition, the same polysiloxane containing alkenyl groups at both ends as that illustrated in the third silicone thermoplastic-thermosetting adhesive composition, and the same hydrosilylation catalyst as that illustrated in the second silicone thermoplastic-thermosetting adhesive composition, respectively.

The polysiloxane containing alkenyl groups in its side chain is a polysiloxane containing two or more alkenyl groups in its side chain. Examples of the polysiloxane containing alkenyl groups in its side chain include a straight chain siloxane-containing polysiloxane, which contains alkenyl groups as a side chain bonded to a main chain (a silicon atom of the main chain) containing a straight chain siloxane portion (—Si—O—), and/or, a branched chain siloxane-containing polysiloxane, which contains alkenyl groups bonded to the silicon atom of the branched chain siloxane portion.

To be specific, the straight chain siloxane-containing polysiloxane is represented by the following formula (10).

Formula (10):

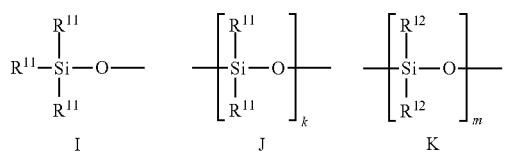

(10)

-continued

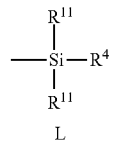

(where, in formula, I to L represent a constituent unit, I and L represent an end unit, and J and K represent a repeating unit. $R^{11}$ represents a monovalent hydrocarbon group and $R^{12}$ represents an alkenyl group. "k" represents an integer of 0 or more and "m" represents an integer of 2 or more.)

I to L constitute the straight chain siloxane-containing polysiloxane.

The monovalent hydrocarbon groups represented by $R^{11}$ in formula (10) may be the same or different from each other. Preferably, the monovalent hydrocarbon groups represented by $R^{11}$ are the same.

An example of the monovalent hydrocarbon group represented by $R^{11}$ includes the same monovalent hydrocarbon group as that represented by $R^1$ in the above-described formula (1). As the monovalent hydrocarbon group represented by $R^{11}$, preferably, methyl and phenyl are used, or more preferably, methyl is used.

"k" represents, in view of reactivity and stability, preferably an integer of 1 to 10000, or more preferably an integer of 1 to 5000.

"m" represents, in view of reactivity and stability, preferably an integer of 2 to 500, or more preferably an integer of 2 to 100.

The number average molecular weight of the straight chain siloxane-containing polysiloxane is, in view of stability and handling ability, for example, 200 to 1000000, or preferably 200 to 80000.

The content of the vinyl group in the straight chain siloxane-containing polysiloxane is, for example, 0.01 mmol/g or more, or preferably 0.1 mmol/g or more, and is, for example, 10 mmol/g or less, or preferably 5 mmol/g or less. The content of the vinyl group in the straight chain siloxane-containing polysiloxane is measured from the area ratio of the vinyl group to the methyl group with a $^1$H-NMR.

The straight chain siloxane-containing polysiloxane can be, for example, synthesized in accordance with a known method. A commercially available product (for example, manufactured by Gelest, Inc.) can be also used.

To be specific, the branched chain siloxane-containing polysiloxane is represented by the following formula (11).

Formula (11):

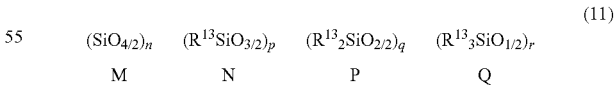

(11)

(where, in formula, M, N, P, and Q represent a constituent unit, M, N, and P represent a repeating unit, and Q represents an end unit. $R^{13}$ represents a monovalent hydrocarbon group. "n" represents an integer of 1 or more, "p" and "q" represent an integer of 0 or more, and "r" represents an integer of 4 or more. In addition, per one molecule, at least two $R^{13}$s are an alkenyl group.)

M, N, P, and Q constitute the branched chain siloxane-containing polysiloxane.

Examples of the monovalent hydrocarbon group represented by $R^{13}$ include a saturated hydrocarbon group, an aromatic hydrocarbon group, and an unsaturated hydrocarbon group (excluding the aromatic hydrocarbon group).

An example of the saturated hydrocarbon group and the aromatic hydrocarbon group includes the same monovalent hydrocarbon group as that represented by $R^1$ in the above-described formula (1). Preferably, methyl and phenyl are used, or more preferably, methyl is used.

An example of the unsaturated hydrocarbon group (excluding the aromatic hydrocarbon group) includes the same alkenyl group as that represented by $R^2$ in the above-described formula (1). Preferably, vinyl is used.

The monovalent hydrocarbon group represented by $R^{13}$ in formula (11) contains at least the alkenyl group, preferably an alkyl group and/or a phenyl group, and the alkenyl group, or more preferably a methyl group and a vinyl group.

The number of the alkenyl group in the branched chain siloxane-containing polysiloxane is 2 or more, preferably 3 or more, and is usually 30 or less.

"n" represents, preferably an integer of 1 to 100, or more preferably an integer of 1 to 50.

"p" represents, preferably an integer of 1 to 100, or more preferably an integer of 1 to 50.

"q" represents, preferably an integer of 1 to 100, or more preferably an integer of 1 to 50.

"r" represents, preferably an integer of 4 to 100, or more preferably an integer of 4 to 30.

The number average molecular weight of the branched chain siloxane-containing polysiloxane is, in view of stability and handling ability, for example, 100 or more, or preferably 200 or more, and is, for example, 10000 or less, or preferably 8000 or less.

The content of the vinyl group in the branched chain siloxane-containing polysiloxane is, for example, 0.01 mmol/g or more, or preferably 0.1 mmol/g or more, and is, for example, 100 mmol/g or less, or preferably 10 mmol/g or less. The content of the vinyl group in the branched chain siloxane-containing polysiloxane is measured from the area ratio of the vinyl group to the methyl group with a $^1$H-NMR.

The branched chain siloxane-containing polysiloxane can be, for example, synthesized in accordance with a known method. A commercially available product (for example, manufactured by Gelest, Inc.) can be also used.

The cage octasilsesquioxane, the polysiloxane containing alkenyl groups at both ends, the hydrosilylation catalyst, and the polysiloxane containing alkenyl groups in its side chain are blended, so that the sixth silicone thermoplastic-thermosetting adhesive composition is prepared.

The mixing ratio of the cage octasilsesquioxane with respect to the sixth silicone thermoplastic-thermosetting adhesive composition is, for example, 10 to 80 mass %, or preferably 10 to 70 mass %.

The mixing proportion of the polysiloxane containing alkenyl groups at both ends is adjusted so that the number of moles of the alkenyl group in the polysiloxane containing alkenyl groups at both ends is smaller than that of the hydrosilyl group in the cage octasilsesquioxane.

That is, the molar ratio (the number of moles of the alkenyl group/the number of moles of the hydrosilyl group) of the alkenyl group to the hydrosilyl group is less than 1, for example, 0.10 to 0.99, preferably 0.20 to 0.99, or more preferably 0.50 to 0.99. In other words, the mixing ratio of the polysiloxane containing alkenyl groups at both ends with respect to 100 parts by mass of the total amount of the cage octasilsesquioxane and the polysiloxane containing alkenyl groups at both ends is, for example, 0.001 parts by mass or more, or preferably 0.01 parts by mass or more, and is, for example, 30 parts by mass or less, or preferably 20 parts by mass or less. Also, the mixing ratio of the polysiloxane containing alkenyl groups at both ends with respect to 100 parts by mass of the total amount of the cage octasilsesquioxane and the polysiloxane containing alkenyl groups at both ends can be set to be, for example, 0.01 parts by mass or more, or preferably 0.1 parts by mass or more, and, is, for example, 100 parts by mass or less, or preferably 50 parts by mass or less.

When the above-described molar ratio exceeds the above-described range, the hydrosilyl group is fewer than the alkenyl group. In such a case, the excess of the hydrosilyl group does not sufficiently remain after the reaction and the thermosetting properties may not be imparted to the sixth silicone thermoplastic-thermosetting adhesive composition.

On the other hand, when the above-described molar ratio is below the above-described range, the hydrosilyl group excessively remains and the cage octasilsesquioxanes themselves undergo hydrolysis by moisture in the air and a self-condensation reaction to be cured, so that flexibility may not be obtained.

The mixing ratio of the hydrosilylation catalyst (solid content) with respect to 100 parts by mass of the total amount of the cage octasilsesquioxane and the polysiloxane containing alkenyl groups at both ends is, for example, $1.0 \times 10^{-10}$ parts by mass or more, or preferably $1.0 \times 10^{-8}$ parts by mass or more, and is, for example, 3 parts by mass or less, or preferably 1 part by mass or less.

The mixing ratio of the polysiloxane containing alkenyl groups in its side chain is adjusted so that the number of moles (X) of the alkenyl group with respect to the number of moles (Y), which is obtained by subtracting the number of moles of the alkenyl group in the polysiloxane containing alkenyl groups at both ends from the number of moles of the hydrosilyl group in the cage octasilsesquioxane, as the molar ratio (X/Y), is, for example, 0.001 or more, or preferably 0.01 or more, and is, for example, 1000 or less, or preferably 100 or less.

In order to prepare the sixth silicone thermoplastic-thermosetting adhesive composition, preferably, a sixth silicone thermoplastic-thermosetting adhesive composition precursor, which is obtained by allowing the cage octasilsesquioxane to react with the polysiloxane containing alkenyl groups at both ends in the presence of the hydrosilylation catalyst, and the polysiloxane containing alkenyl groups in its side chain are blended.

That is, first, the cage octasilsesquioxane is allowed to react with the polysiloxane containing alkenyl groups at both ends in the presence of the hydrosilylation catalyst at such a mixing proportion that the number of moles of the hydrosilyl group in the cage octasilsesquioxane is larger (excessive) than that of the alkenyl group in the polysiloxane containing alkenyl groups at both ends. In this way, the sixth silicone thermoplastic-thermosetting adhesive composition precursor is obtained.

To be more specific, in order to obtain the sixth silicone thermoplastic-thermosetting adhesive composition precursor, the above-described cage octasilsesquioxane and the above-described polysiloxane containing alkenyl groups at both ends are blended at the above-described mixing proportion, along with the hydrosilylation catalyst, and the solvent as required, and thereafter, the mixture is heated as required.

Examples of the solvent include an aromatic hydrocarbon such as toluene, an aliphatic hydrocarbon such as hexane, and ester such as ethyl acetate. Preferably, in view of improving compatibility of each of the components, an aromatic hydrocarbon is used, or more preferably, toluene is used.

The reaction temperature is, for example, 0° C. or more, or preferably 20° C. or more, and is, for example, 100° C. or less, or preferably 80° C. or less and the reaction duration is, for example, 0.5 to 96 hours.

In this way, the cage octasilsesquioxane is allowed to react with the polysiloxane containing alkenyl groups at both ends. That is, the hydrosilyl group in the cage octasilsesquioxane and the alkenyl group in the polysiloxane containing alkenyl groups at both ends are allowed to undergo the hydrosilylation reaction.

The degree of the hydrosilylation reaction of the hydrosilyl group in the cage octasilsesquioxane with the alkenyl group in the polysiloxane containing alkenyl groups at both ends can be checked by $^1$H-NMR measurement based on the intensity of a signal derived from the alkenyl group in the polysiloxane containing alkenyl groups at both ends. The hydrosilylation reaction is considered to be terminated at the time of disappearance of the signal.

In the above-described hydrosilylation reaction, the cage octasilsesquioxane is allowed to react with the polysiloxane containing alkenyl groups at both ends so that the number of moles of the hydrosilyl group is excessive compared with the number of moles of the alkenyl group. After the reaction, the excess of the hydrosilyl group remains.

In this way, the sixth silicone thermoplastic-thermosetting adhesive composition precursor is obtained.

The sixth silicone thermoplastic-thermosetting adhesive composition precursor is in a liquid state or in a semi-solid state.

Next, the obtained sixth silicone thermoplastic-thermosetting adhesive composition precursor and the polysiloxane containing alkenyl groups in its side chain are blended at the above-described proportion. By the subsequent heating (described later), the sixth silicone thermoplastic-thermosetting adhesive composition precursor is allowed to react with the polysiloxane containing alkenyl groups in its side chain. The solvent is distilled off as required.

In this way, the sixth silicone thermoplastic-thermosetting adhesive composition can be obtained.

The obtained sixth silicone thermoplastic-thermosetting adhesive composition is in a solid state. The sixth silicone thermoplastic-thermosetting adhesive composition in a solid state is obtained because the mobility of the polysiloxane containing alkenyl groups at both ends is reduced due to the steric hindrance of the cage octasilsesquioxane.

In the sixth silicone thermoplastic-thermosetting adhesive composition, the molar ratio of the monovalent hydrocarbon group: hydrogen in the cage octasilsesquioxane is within a specific range and thus, in the cage octasilsesquioxane, the proportion of the hydrosilyl group to be reacted with the alkenyl group in the polysiloxane containing alkenyl groups at both ends is adjusted. Furthermore, the polysiloxane containing alkenyl groups at both ends is allowed to react with the cage octasilsesquioxane so that the alkenyl group thereof has the number of moles that is smaller than the number of moles of the hydrosilyl group in the cage octasilsesquioxane. Thus, the obtained sixth silicone thermoplastic-thermosetting adhesive composition can have both the thermoplastic and thermosetting properties, while having an excellent transparency and heat resistance.

That is, the sixth silicone thermoplastic-thermosetting adhesive composition is once plasticized (or liquefied) by the above-described heating and then, is cured by heating.

The sixth silicone thermoplastic-thermosetting adhesive composition exhibits the thermoplastic properties based on an increase in mobility of the cage octasilsesquioxane and the polysiloxane containing alkenyl groups at both ends by heating.

The thermoplastic temperature of the sixth silicone thermoplastic-thermosetting adhesive composition is, for example, 40° C. or more, or preferably 50° C. or more, and is, for example, 150° C. or less, or preferably 100° C. or less. The thermoplastic temperature is the temperature at which the sixth silicone thermoplastic-thermosetting adhesive composition shows the thermoplastic properties. To be specific, the thermoplastic temperature is the temperature at which the sixth silicone thermoplastic-thermosetting adhesive composition in a solid state is softened by heating to be brought into a completely liquid state and is substantially the same as the softening temperature.

To be specific, the thermosetting properties of the once plasticized sixth silicone thermoplastic-thermosetting adhesive composition are exhibited by allowing the hydrosilyl group that remains in the sixth silicone thermoplastic-thermosetting adhesive composition precursor to react with the alkenyl group in the polysiloxane containing alkenyl groups in its side chain.

To be more specific, the hydrosilyl group in the cage octasilsesquioxane in the sixth silicone thermoplastic-thermosetting adhesive composition precursor and the alkenyl group in the polysiloxane containing alkenyl groups in its side chain are allowed to undergo the hydrosilylation reaction.

The thermosetting temperature of the sixth silicone thermoplastic-thermosetting adhesive composition is relatively low and is, for example, 100 to 250° C., or preferably 120 to 250° C. The thermosetting temperature is the temperature at which the sixth silicone thermoplastic-thermosetting adhesive composition shows the thermosetting properties. To be specific, the thermosetting temperature is the temperature at which the plasticized sixth silicone thermoplastic-thermosetting adhesive composition is cured by heating to be brought into a completely solid state.

In the sixth silicone thermoplastic-thermosetting adhesive composition, the alkenyl group in the polysiloxane containing alkenyl groups in its side chain is allowed to react with the residual hydrosilyl group in the cage octasilsesquioxane and thus, the cage octasilsesquioxane can be cross-linked. Thus, the flexibility of the sixth silicone thermoplastic-thermosetting adhesive composition can be improved.

The sixth silicone thermoplastic-thermosetting adhesive composition can lower its thermosetting temperature (for example, 100 to 250° C.).

The above-described silicone thermoplastic-thermosetting adhesive composition is formed as a silicone formed product (ref: a numeral 9 shown by a phantom line in FIG. 2(*a*)-(*c*) to be described later) in, for example, a sheet shape, an aggregated shape (a block shape), or a particle shape (a powder shape). Preferably, the above-described silicone thermoplastic-thermosetting adhesive composition is formed as a silicone formed product in an aggregated shape.

In the phosphor layer attaching kit, a percentage of the following peel strength of the silicone pressure-sensitive adhesion composition is 30% or more, preferably 35% or more, or more preferably 40% or more, and, is, for example, 200% or less, or preferably 150% or less.

Percentage of peel strength=[(peel strength $PS_{75° C.}$ in an atmosphere at 75° C.)/(peel strength $PS_{25° C.}$ in an atmosphere at 25° C.)]×100

Peel Strength $PS_{75° C.}$ in an atmosphere at 75° C.: a peel strength at a temperature of 75° C. at the time of peeling a support and a pressure-sensitive adhesion layer from a phosphor layer at a peel angle of 180 degrees and a rate of 300 mm/min after attaching the pressure-sensitive adhesion layer formed from the silicone pressure-sensitive adhesion composition and laminated on the support to the phosphor layer, that is, a peel strength of the pressure-sensitive adhesion layer with respect to the phosphor layer in an atmosphere at 75° C. The thickness of the pressure-sensitive adhesion layer in the evaluation of the peel strength is 40 µm.

Peel Strength $PS_{25°\ C.}$ in an atmosphere at 25° C.: a peel strength at a temperature of 25° C. at the time of peeling a support and a pressure-sensitive adhesion layer from a phosphor layer at a peel angle of 180 degrees and a rate of 300 mm/min after attaching the pressure-sensitive adhesion layer formed from the silicone pressure-sensitive adhesion composition and laminated on the support to the phosphor layer, that is, a peel strength of the pressure-sensitive adhesion layer with respect to the phosphor layer in an atmosphere at 25° C. The thickness of the pressure-sensitive adhesion layer in the evaluation of the peel strength is 40 µm.

When the percentage of the peel strength is below 30%, there is a disadvantage that an interfacial peeling occurs between the adhesive layer that is formed from the silicone pressure-sensitive adhesion composition and the phosphor layer.

Figure 9:
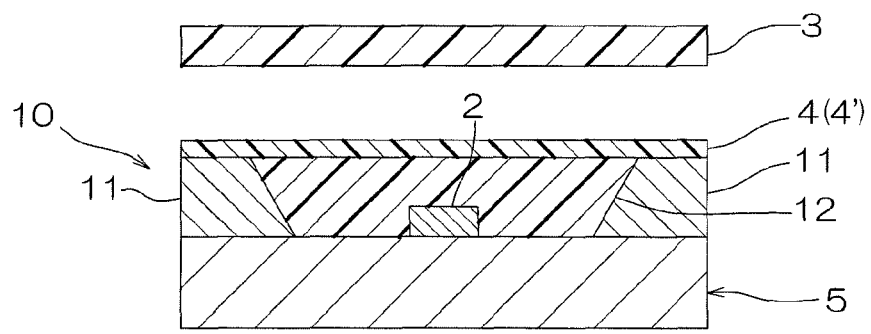
FIG. 9 (a) illustrating a step of preparing an LED package in which a silicone pressure-sensitive adhesion layer is laminated and a phosphor layer and FIG. 9 (b) illustrating a step of attaching the phosphor layer to the LED package via the silicone pressure-sensitive adhesion layer.
Figure 9:
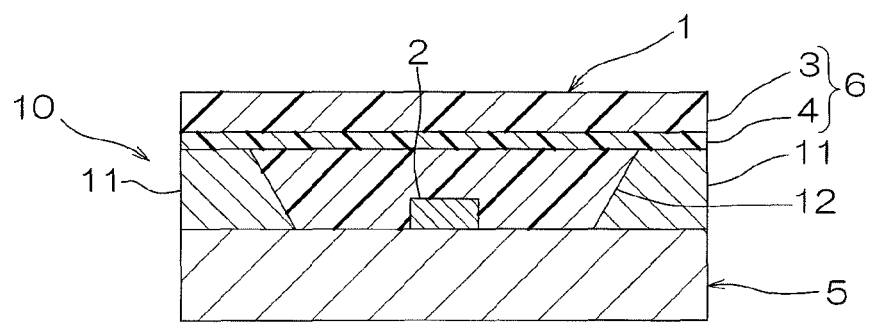

On the other hand, when the adhesive force of the silicone pressure-sensitive adhesion composition is not more than the above-described upper limit, in a case where an LED 2 (ref: FIGS. 1 to 9) or an LED package 10 (ref: FIGS. 8 and 9), both of which are an object to be attached, have a damage, a phosphor attaching sheet 6 (ref: FIG. 2 (b)) to be described later is once removed from the LED 2 or the LED package 10, and a repair of repairing the LED 2 or the LED package 10 is capable of being easily performed.

Next, an LED-phosphor layer attaching body 1 obtained by using one embodiment of the above-described phosphor layer attaching kit of the present invention is described with reference to FIG. 1.

Figure 1:
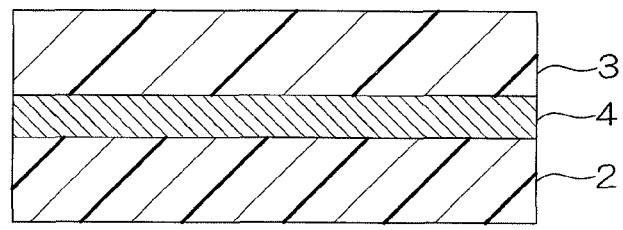
FIG. 1 shows a sectional view of an LED-phosphor layer attaching body obtained by using one embodiment of a phosphor layer attaching kit of the present invention.

In FIG. 1, the LED-phosphor layer attaching body 1 as one embodiment of the present invention includes the LED 2, a phosphor layer 3 that is disposed in opposed relation to the upper side of the LED 2, and a silicone pressure-sensitive adhesion layer 4 that is interposed between the LED 2 and the phosphor layer 3.

Figure 4A:
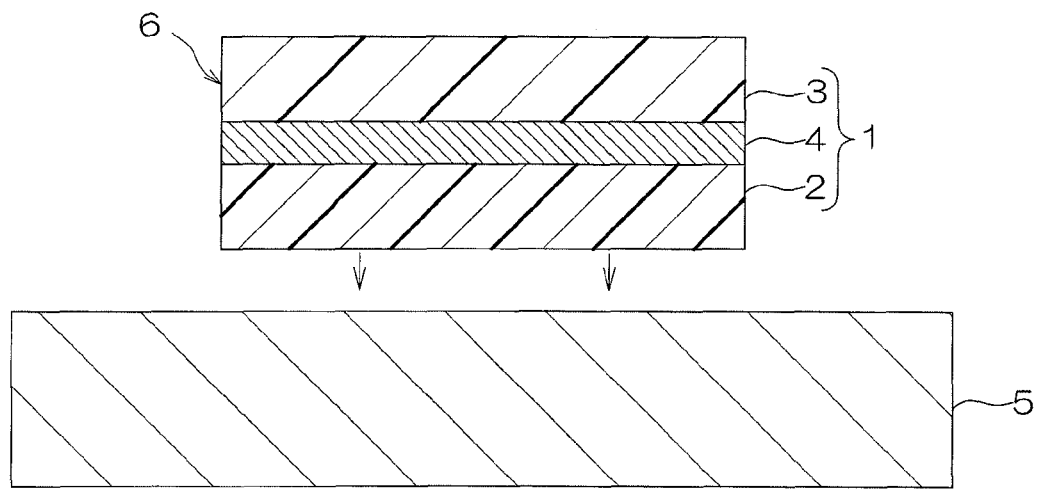
FIG. 4(a)-(b) shows process drawings for illustrating a method for producing an LED device using the LED-phosphor layer attaching body shown in FIG. 1.
Figure 4B:
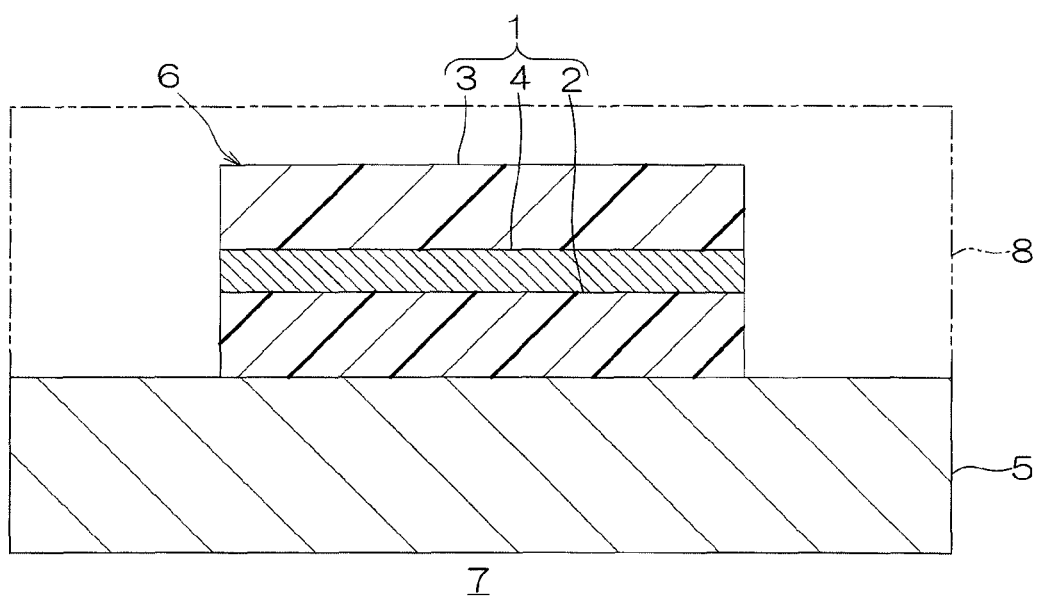

The LED 2 is formed into a generally flat plate shape in a generally rectangular shape in sectional view and is formed from a known semiconductor material. In the LED 2, though not shown, an LED-side terminal to be electrically connected to a substrate-side terminal of a substrate 5 (ref: FIG. 4(a)-(b)) to be described later is provided.

The LED 2 and the phosphor layer 3 are attached to the silicone pressure-sensitive adhesion layer 4. The attachment (attaching) includes a pressure-sensitive adhesion such as pressure-sensitive adhering based on the viscous properties (viscosity) of the silicone pressure-sensitive adhesion layer 4 prepared from a silicone pressure-sensitive adhesive composition and adhering based on the thermal curing after the silicone pressure-sensitive adhesion layer 4 prepared from a silicone thermoplastic-thermosetting adhesive composition is plasticized.

The thickness of the silicone pressure-sensitive adhesion layer 4 is, in view of pressure-sensitive adhesion properties (attaching properties), for example, 5 µm or more, and is, for example, 200 µm or less, preferably, in view of thermal conduction of generated heat by the LED 2 and the phosphor layer 3, 100 µm or less, or more preferably 50 µm or less.

<First Usage of Phosphor Layer Attaching Kit>

Next, as a first usage of a phosphor layer attaching kit, an embodiment in which the silicone pressure-sensitive adhesion layer 4 in the LED-phosphor layer attaching body 1 is prepared from a silicone pressure-sensitive adhesive composition, which is also a method for producing the LED-phosphor layer attaching body 1, is described with reference to solid lines in FIG. 2 (a)-(c).

In this method, as shown in FIG. 2 (a), first, the phosphor layer 3 is prepared.

Next, in this method, as shown in FIG. 2 (b), the silicone pressure-sensitive adhesion layer 4 that is prepared from a silicone pressure-sensitive adhesive composition is laminated on the upper surface of the phosphor layer 3.

To be specific, when the silicone pressure-sensitive adhesive composition is prepared as a varnish, the varnish is applied or is applied dropwise onto the entire upper surface of the phosphor layer 3. In this way, a film 4' of the silicone pressure-sensitive adhesive composition is formed. Subsequently, a solvent is distilled off as required.

In this way, the silicone pressure-sensitive adhesion layer 4 prepared from the silicone pressure-sensitive adhesive composition (that is, a silicone pressure-sensitive adhesive layer) is formed on the surface of the phosphor layer 3.

In this way, the phosphor attaching sheet 6 in which the silicone pressure-sensitive adhesion layer 4 is laminated on the phosphor layer 3 is obtained.

Thereafter, in this method, as shown in FIG. 2 (c), the phosphor attaching sheet 6 is attached to the LED 2. To be specific, the LED 2 is allowed to pressure-sensitively adhere to the phosphor layer 3 via the silicone pressure-sensitive adhesion layer 4. That is, the lower surface of the LED 2 is brought into contact with the upper surface of the silicone pressure-sensitive adhesion layer 4.

The attachment of the phosphor attaching sheet 6 to the LED 2 is performed at a normal temperature (to be specific, 20 to 25° C.). Alternatively, the attaching thereof can be also performed by heating the phosphor attaching sheet 6 at, for example, 30 to 50° C. as required.

The LED 2 can be pressed toward the phosphor layer 3 at an appropriate pressure as required. In some cases, the thickness of the silicone pressure-sensitive adhesion layer 4 can be controlled by the pressing.

In this way, the LED-phosphor layer attaching body 1 in which the LED 2 and the phosphor layer 3 are allowed to pressure-sensitively adhere to each other via the silicone pressure-sensitive adhesion layer 4 is produced.

Next, a method for producing an LED device 7 by mounting the LED 2 in the LED-phosphor layer attaching body 1 in FIG. 2 (c) on the substrate 5 is described with reference to FIG. 4(a)-(b).

In this method, first, as shown in FIG. 4 (a), the substrate 5 and the LED-phosphor layer attaching body 1 are prepared, respectively.

The substrate 5 is formed into a slightly larger flat plate shape than the LED-phosphor layer attaching body 1 in plane view. The substrate 5 is formed of, for example, an insulating substrate such as a laminated substrate in which an insulating layer is laminated on a silicon substrate, a ceramic substrate, a polyimide resin substrate, or a metal substrate.

On the upper surface of the substrate 5, a conductive pattern (not shown) including a substrate-side terminal (not shown) to be electrically connected to an LED-side terminal (not shown) in the LED 2 and a wire to be continuous thereto is formed. The conductive pattern is, for example, formed of a conductor such as gold, copper, silver, or nickel.

The LED-phosphor layer attaching body 1 is disposed at the upper side of the substrate 5 so that the LED 2 faces downwardly.

Next, as shown in FIG. 4 (*b*), the LED 2 in the LED-phosphor layer attaching body 1 is mounted on the substrate 5. To be specific, the LED-side terminal (not shown) in the LED 2 is flip-chip mounted on or wire-bonding connected to the substrate-side terminal (not shown) in the substrate 5. When the LED 2 is wire-bonding connected to the substrate 5, the phosphor attaching sheet 6 to be attached to the LED 2 is formed into a shape of avoiding (going around) a wire.

In this way, the LED device 7 that includes the substrate 5 and the LED-phosphor layer attaching body 1 and in which the LED 2 in the LED-phosphor layer attaching body 1 is mounted on the substrate 5 is obtained.

Thereafter, as shown by the phantom line in FIG. 4 (*b*), a first encapsulating layer 8 can be provided in the LED device 7 as required. The first encapsulating layer 8 is, on the substrate 5, formed from a transparent resin so as to cover the LED 2 and the phosphor attaching sheet 6. After the first encapsulating layer 8 is provided in the LED device 7, the size thereof is adjusted by, for example, dicing as required.

In the phosphor layer attaching kit, the percentage of the peel strength of the silicone pressure-sensitive adhesion composition for attaching the phosphor layer 3 to the LED 2 is 30% or more, so that it has excellent heat resistance and durability.

To be more specific, the adhesive force at a high temperature (for example, a high temperature including 75° C.) of the silicone pressure-sensitive adhesion composition can be prevented from being remarkably reduced compared to the adhesive force at a normal temperature (25° C.) of the silicone pressure-sensitive adhesion composition, so that excellent heat resistance is capable of being ensured.

Thus, the LED device 7 including the LED 2 and the phosphor attaching sheet 6 that is fabricated from the phosphor layer attaching kit and in which the phosphor layer 3 is attached to the LED 2 via the silicone pressure-sensitive adhesion layer 4 prepared from the silicone pressure-sensitive adhesion composition is capable of ensuring excellent light emitting reliability over a long period of time.

<Second Usage of Phosphor Layer Attaching Kit>

Next, as a second usage of a phosphor layer attaching kit, an embodiment in which the silicone pressure-sensitive adhesion layer 4 in the LED-phosphor layer attaching body 1 is prepared from a silicone thermoplastic-thermosetting adhesive composition, which is also a method for producing the LED-phosphor layer attaching body 1, is described with reference to the phantom lines in FIG. 2(*a*)-(*c*).

In this method, as shown in FIG. 2 (*a*), first, the phosphor layer 3 is prepared.

Thereafter, the phosphor layer 3 is heated. To be specific, the phosphor layer 3 is brought into contact with a hot plate 15 (the phantom line). To be more specific, the phosphor layer 3 is disposed on the upper surface of the hot plate 15 (the phantom line).

The temperature of the hot plate 15 is, for example, adjusted to the above-described thermoplastic temperature of the silicone thermoplastic-thermosetting adhesive composition. To be specific, the temperature of the hot plate 15 is, for example, 40° C. or more, preferably 50° C. or more, or more preferably 80° C. or more, and is, for example, 200° C. or less, preferably 150° C. or less, or more preferably 100° C. or less.

Next, in this method, as shown in FIG. 2 (*b*), the silicone pressure-sensitive adhesion layer 4 is laminated on the upper surface of the phosphor layer 3.

To be specific, a silicone formed product 9 (the phantom line) in the above-described shape, preferably the silicone formed product 9 in an aggregated shape is disposed on the upper surface of the phosphor layer 3.

For example, a base area S1 of the silicone formed product 9 is smaller than an area S2 of the upper surface of the phosphor layer 3 (S1<S2). To be specific, the ratio thereof (=S1/S2) is, for example, 0.1 or more, or preferably 0.6 or more, and is, for example, less than 1, or preferably 0.95 or less.

When the base area S1 of the silicone formed product 9 is smaller than the area S2 of the upper surface of the phosphor layer 3 (S1<S2), the silicone formed product 9 is, for example, disposed in the central portion on the upper surface of the phosphor layer 3.

The phosphor layer 3 is disposed on the hot plate 15 (the phantom line), so that the silicone formed product 9 is heated and thus, is plasticized.

By the above-described plasticization, the silicone formed product 9 flows on the upper surface of the phosphor layer 3. When the silicone formed product 9 is disposed in the central portion on the upper surface of the phosphor layer 3, for example, as shown by arrows in phantom lines in FIG. 2 (*a*), the phosphor layer 3 is dispersed outwardly in the plane direction (the direction along the upper surface of the phosphor layer 3), to be specific, from the central portion of the phosphor layer 3 toward the circumference end portion thereof.

The silicone formed product 9, for example, flows without falling from the upper surface of the phosphor layer 3.

In this way, as shown in FIG. 2 (*b*), the dispersed silicone thermoplastic-thermosetting adhesive composition is laminated on the upper surface of the phosphor layer 3 with a uniform thickness in the plane direction. In this way, the film 4' of the silicone thermoplastic-thermosetting adhesive composition is formed on the entire upper surface of the phosphor layer 3.

Subsequently, the LED 2 is laminated at the upper side of the phosphor layer 3 via the film 4' of the silicone thermoplastic-thermosetting adhesive composition. That is, the LED 2 is brought into contact with the film 4'.

Thereafter, the phosphor layer 3 in which the LED 2 is laminated at the upper side thereof via the film 4' is taken out (taken up) from the hot plate 15 (the phantom line) and the phosphor layer 3 is disposed on the upper surface of a stand (not shown) at a room temperature (20 to 25° C.).

In this way, the film 4' of the silicone thermoplastic-thermosetting adhesive composition is cooled to be solidified.

In this way, as shown in FIG. 2 (*b*), the silicone pressure-sensitive adhesion layer 4 (that is, the silicone thermoplastic-thermosetting adhesive layer) prepared from the silicone thermoplastic-thermosetting adhesive composition in a solid state allows the phosphor layer 3 and the LED 2 to adhere thereto. That is, the silicone pressure-sensitive adhesion layer 4 is brought into tight contact with the entire upper surface of the phosphor layer 3 and the entire lower surface of the LED 2.

In this way, the LED-phosphor layer attaching body 1 in which the LED 2 and the phosphor layer 3 adhere to each other via the silicone pressure-sensitive adhesion layer 4 based on the thermal curing thereof is produced.

Next, the LED device 7 is produced using the LED-phosphor layer attaching body 1.

In the second usage, as the method for producing the LED device 7 using the LED-phosphor layer attaching body 1, the same method as the first usage shown in FIGS. 4 (*a*) and 4 (*b*) is used.

According to the second usage, the same function and effect as that of the first usage can be achieved. Furthermore, the silicone pressure-sensitive adhesion layer 4 is formed using the silicone thermoplastic-thermosetting adhesive composition in a solid state, so that the handling ability of the phosphor layer attaching kit is capable of being improved.

Other Embodiments

In FIGS. 3 and 5 to 9, the same reference numerals are provided for members and steps corresponding to each of those described above, and their detailed description is omitted.

In the above-described first and second usages, as the usage of the phosphor layer attaching kit, as shown in FIG. 2 (b), the silicone pressure-sensitive adhesion layer 4 is laminated on the phosphor layer 3 to form the phosphor attaching sheet 6 and thereafter, as shown in FIG. 2 (c), the silicone pressure-sensitive adhesion layer 4 is attached to the LED 2. On the other hand, for example, as shown in FIG. 3 (b), first, the silicone pressure-sensitive adhesion layer 4 is laminated on the LED 2 and thereafter, as shown in FIG. 3 (c), the silicone pressure-sensitive adhesion layer 4 can be attached to the phosphor layer 3.

Figure 3A:
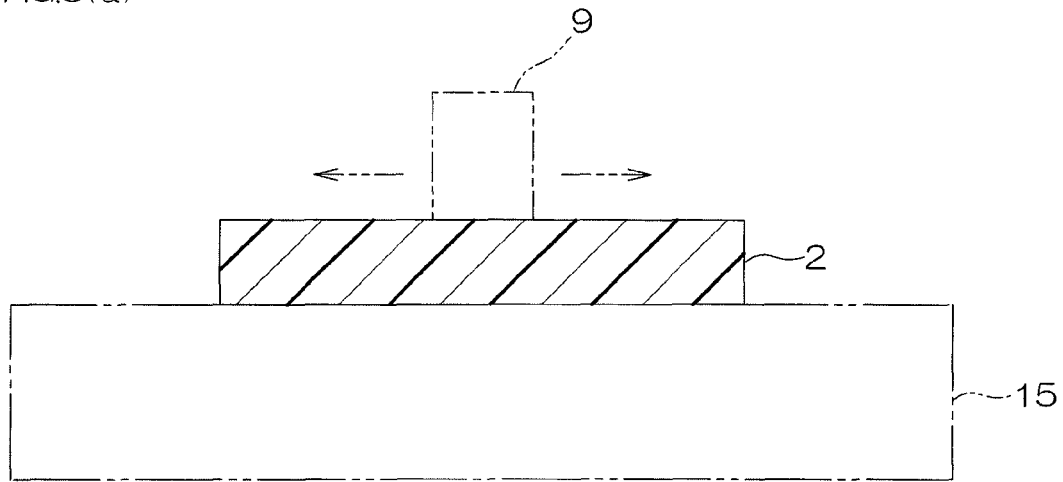
FIG. 3(a)-(c) shows process drawings for illustrating a method for producing the LED-phosphor layer attaching body shown in FIG. 1.
Figure 3B:
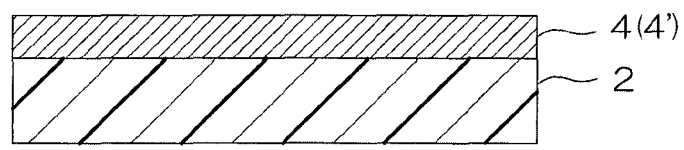
Figure 3C:
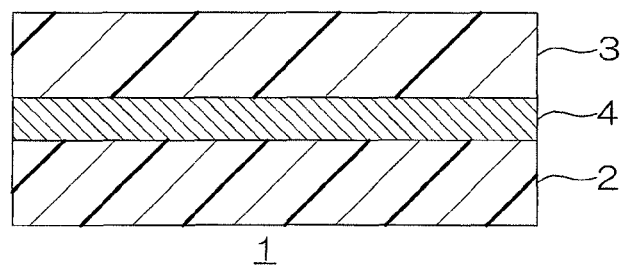

In this method, as shown in FIG. 3 (a), first, the LED 2 is prepared.

Next, in this method, as shown in FIG. 3 (b), the silicone pressure-sensitive adhesion layer 4 is laminated on the upper surface of the LED 2.

Thereafter, as shown in FIG. 3 (c), the silicone pressure-sensitive adhesion layer 4 is attached to the phosphor layer 3. To be specific, the lower surface of the phosphor layer 3 is brought into contact with the upper surface of the silicone pressure-sensitive adhesion layer 4.

Furthermore, in the embodiments in FIGS. 2 and 3, the silicone pressure-sensitive adhesion layer 4 is laminated on either one of the LED 2 or the phosphor layer 3 and thereafter, the silicone pressure-sensitive adhesion layer 4 is attached to the other one. Alternatively, for example, as shown in FIGS. 2 (b) and 3 (b), the silicone pressure-sensitive adhesion layer 4 can be laminated on both the LED 2 and the phosphor layer 3 and thereafter, the LED 2 and the phosphor layer 3 can be attached to each other via the two silicone pressure-sensitive adhesion layers 4.

In the LED-phosphor layer attaching body 1 in the embodiment in FIG. 1, the phosphor layer 3 is allowed to adhere to only the upper surface of the LED 2 via the silicone pressure-sensitive adhesion layer 4. Alternatively, for example, as shown by the upper side view in FIG. 5 (a), the phosphor layer 3 can be also allowed to adhere to both of the upper surface and the side surfaces of the LED 2 via the silicone pressure-sensitive adhesion layer 4.

Figure 5A:
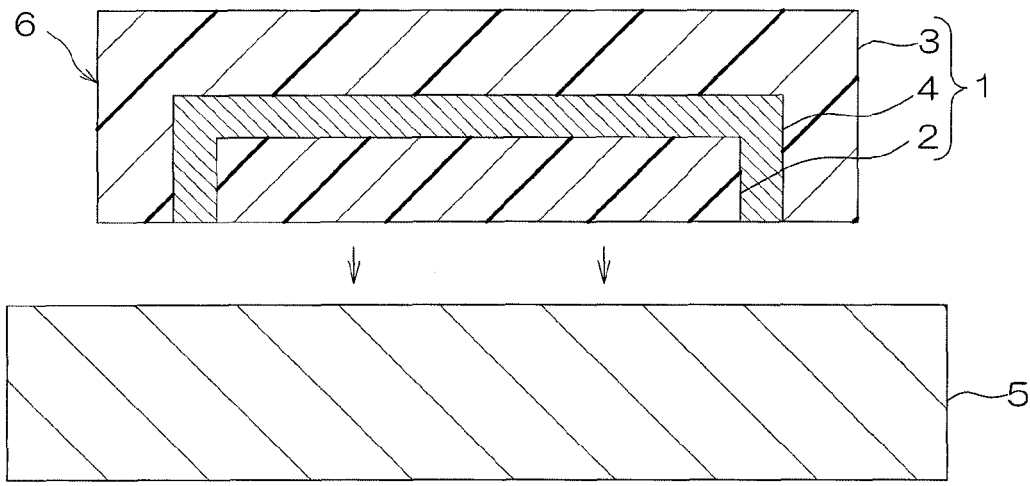
FIG. 5(a)-(b) shows process drawings for illustrating a method for producing an LED device using an LED-phosphor layer attaching body in another embodiment.
Figure 5B:
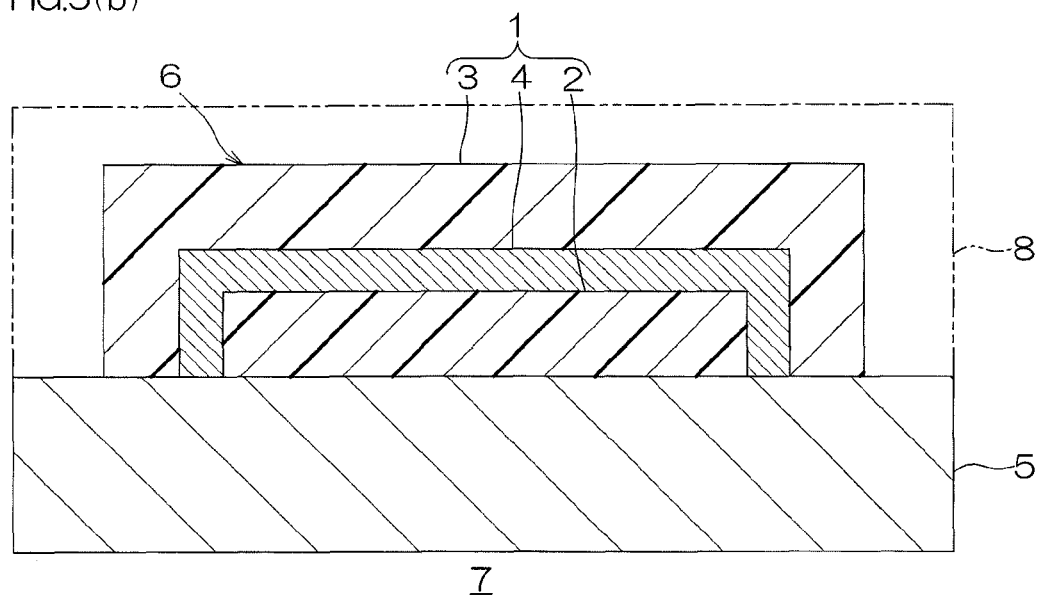

As shown by the upper side view in FIG. 5 (a), the silicone pressure-sensitive adhesion layer 4 is continuously laminated on the upper surface and the side surfaces of the LED 2.

The phosphor layer 3 is laminated on the surfaces (the upper surface and the side surfaces) of the silicone pressure-sensitive adhesion layer 4.

The phosphor layer 3 and the silicone pressure-sensitive adhesion layer 4 are formed into a generally U-shape in sectional view having an opening facing downwardly.

In this way, the phosphor layer 3 adheres to both surfaces of the upper surface and the side surface of the LED 2 via the silicone pressure-sensitive adhesion layer 4.

In order to obtain the LED-phosphor layer attaching body 1 shown in FIG. 5 (a), as referred in FIG. 2 (a), the phosphor layer 3 is formed in a larger size than that of the LED 2 and subsequently, as referred in FIG. 2 (b), the silicone pressure-sensitive adhesion layer 4 is laminated on the entire upper surface of the phosphor layer 3 and the phosphor attaching sheet 6 in a larger size than that of the LED 2 is obtained.

Subsequently, as shown in FIG. 5 (a), the phosphor attaching sheet 6 is attached to the LED 2 so that the silicone pressure-sensitive adhesion layer 4 is laminated on the upper surface and the side surfaces of the LED 2.

In this way, the LED-phosphor layer attaching body 1 is obtained.

Thereafter, as shown in FIG. 5 (b), the LED 2 in the obtained LED-phosphor layer attaching body 1 is mounted on the substrate 5, so that the LED device 7 is obtained.

Thereafter, as shown by the phantom line in FIG. 5 (b), the first encapsulating layer 8 is provided in the LED device 7 as required.

In the LED-phosphor layer attaching body 1 shown in FIG. 5 (a) and the LED device 7 shown in FIG. 5 (b), the same function and effect as that described above can be achieved.

Figure 6A:
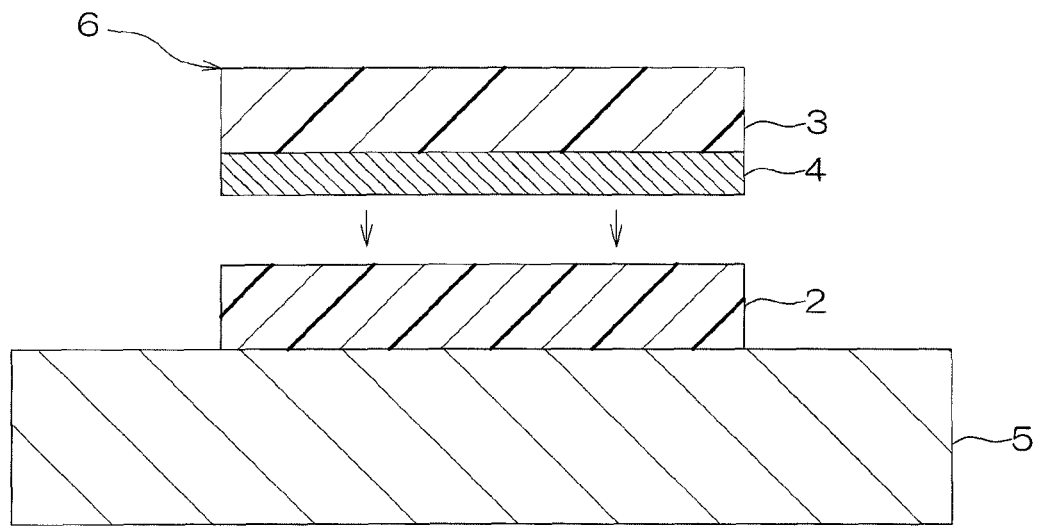
FIG. 6(a)-(b) shows process drawings for illustrating another embodiment of a method for producing an LED device.
Figure 6B:
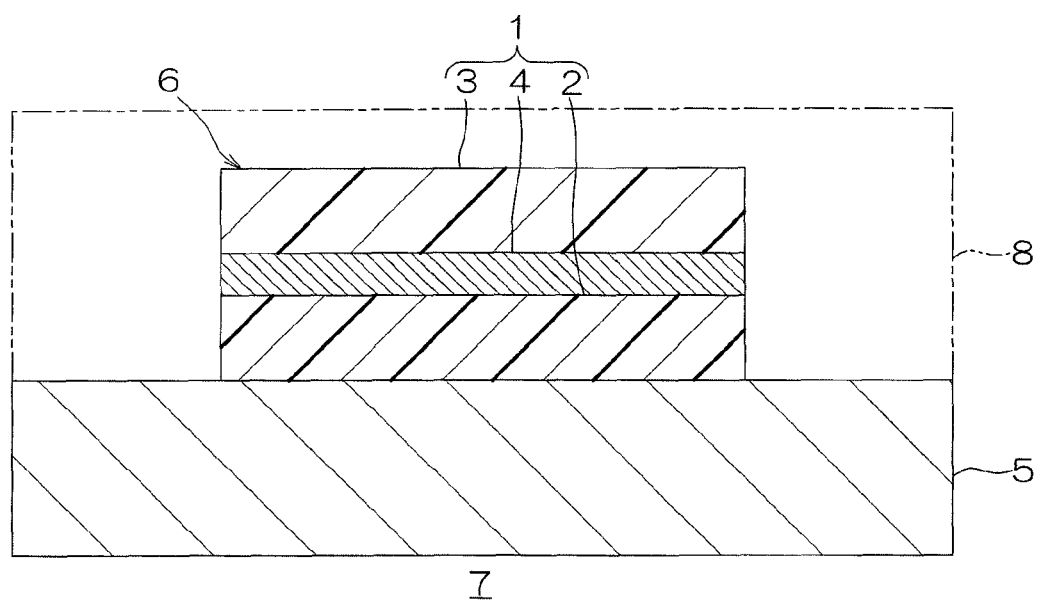

In the embodiment in FIG. 4(a)-(b), first, as shown in FIG. 4 (a), the LED-phosphor layer attaching body 1 is separately fabricated from the substrate 5. Thereafter, as shown in FIG. 4 (b), the LED 2 in the LED-phosphor layer attaching body 1 is mounted on the substrate 5. Alternatively, as shown in FIG. 6(a)-(b), the LED 2 is mounted on the substrate 5 in advance and separately, the phosphor attaching sheet 6 is prepared. Thereafter, the LED-phosphor layer attaching body 1 can be fabricated on the substrate 5.

In the embodiment in FIG. 6(a)-(b), as shown in FIG. 6 (b), the LED-phosphor layer attaching body 1 is fabricated on the substrate 5.

In order to fabricate the LED-phosphor layer attaching body 1 on the substrate 5, first, as shown in FIG. 6 (a), the LED 2 that is mounted on the substrate 5 in advance is prepared and separately, the phosphor attaching sheet 6 is prepared in advance.

Thereafter, as shown in FIG. 6 (b), the phosphor layer 3 is attached to the LED 2 via the silicone pressure-sensitive adhesion layer 4.

In this way, the LED device 7 is obtained.

As shown by the phantom line in FIG. 6 (b), the first encapsulating layer 8 is provided in the LED device 7 as required.

In the embodiment in FIG. 6(a)-(b), the same function and effect as that in FIG. 4(a)-(b) can be achieved.

As shown in FIG. 7 (b), on the substrate 5, the phosphor attaching sheet 6 in a larger size than that of the LED 2 is attached to the upper surface and the side surfaces of the LED 2, so that the LED-phosphor layer attaching body 1 can be formed on the substrate 5.

Figure 7A:
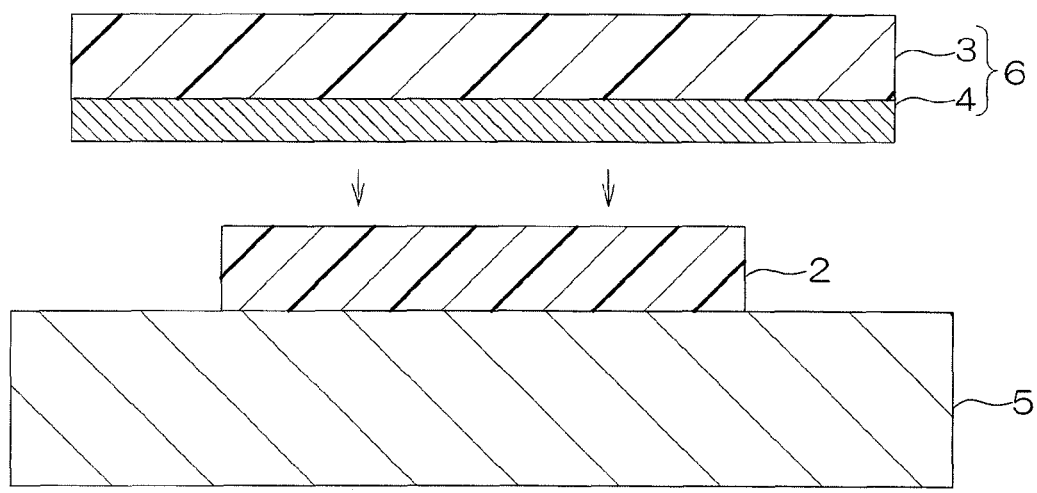
FIG. 7(a)-(b) shows process drawings for illustrating another embodiment of a method for producing an LED device.
Figure 7B:
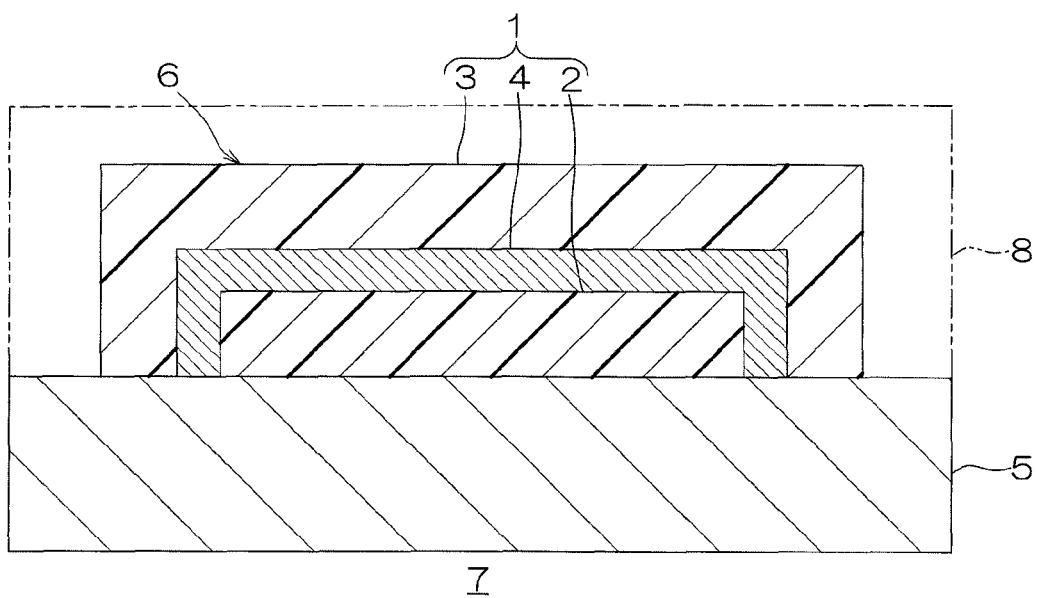

In the embodiment in FIG. 7(a)-(b), as shown in FIG. 7 (a), the phosphor attaching sheet 6 and the LED 2 that is mounted on the substrate 5 in advance are prepared, respectively and thereafter, as shown in FIG. 7 (b), the phosphor attaching sheet 6 is allowed to adhere to the upper surface and the side surfaces of the LED 2.

Thereafter, as shown by the phantom line in FIG. 7 (b), the first encapsulating layer 8 is provided as required.

In the embodiment in FIG. 7(a)-(b), the same function and effect as that in FIG. 6(a)-(b) can be achieved.

In the embodiments in FIGS. 4 to 7, the phosphor attaching sheet 6 is attached to the LED 2. Alternatively, for example, as shown in FIG. 8(a)-(b), the phosphor attaching sheet 6 can be attached to the LED package 10.

In FIG. 8 (a), the LED package 10 includes the substrate 5, the LED 2 that is mounted on the substrate 5, a reflector 11 that is formed on the substrate 5 and is disposed, when projected in the thickness direction, so as to surround the LED 2, and a second encapsulating layer 12 that fills the inside of the reflector 11 and encapsulates the LED 2.

The LED 2 is mounted on the substrate 5 in advance.

The reflector 11 is, in plane view, formed into a generally rectangular frame shape or a generally ring shape (a circular ring shape or an elliptical ring shape) having an opening in its center. The reflector 11 is also, in sectional view, formed into a generally trapezoidal shape in which its width is gradually reduced toward the upper side. The reflector 11 is disposed at spaced intervals to the LED 2 so as to surround the LED 2. That is, the LED 2 is disposed in the inside of the reflector 11.

The reflector 11 is, for example, formed from a sintered body of a ceramic material that contains a light reflecting component (for example, a titanium oxide) or a reflecting resin composition that contains a light reflecting component. The reflector 11 reflects light emitted from the LED 2.

The second encapsulating layer 12 fills the inside of the reflector 11. To be specific, the second encapsulating layer 12 is formed so as to cover the inner side surfaces of the reflector 11, a portion of the upper surface of the substrate 5 that is exposed from the LED 2, and the upper surface and the outer side surfaces of the LED 2.

The upper surface of the second encapsulating layer 12 is formed so as to form the same plane surface along the plane direction (a direction perpendicular to the thickness direction) as the upper surface of the reflector 11. In the upper surface of the second encapsulating layer 12, though not shown, a concave portion (not shown) that gradually dents downwardly from the circumference end portion toward the central portion may be formed.

In order to attach the phosphor attaching sheet 6 to the LED package 10, as shown in FIG. 8 (*a*), the phosphor attaching sheet 6 and the LED package 10 are prepared, respectively.

Next, when the silicone pressure-sensitive adhesion layer 4 is formed from the silicone pressure-sensitive adhesive composition, as shown in FIG. 8 (*b*), the phosphor attaching sheet 6 is attached to the upper surface of the LED package 10 at a normal temperature (to be specific, 20 to 25° C.). Alternatively, the phosphor attaching sheet 6 can be heated at, for example, 30 to 50° C. as required and the attachment thereof can be performed.

On the other hand, when the silicone pressure-sensitive adhesion layer 4 is formed from the silicone thermoplastic-thermosetting adhesive composition, the LED package 10 is heated in advance and next, the silicone pressure-sensitive adhesion layer 4 is disposed on the upper surface of the LED package 10. In this way, the film 4' of the silicone thermo-plastic-thermosetting adhesive composition is formed on the entire upper surface of the LED package 10.

Thereafter, the LED package 10 is disposed on the upper surface of a stand (not shown) at a room temperature (20 to 25° C.) and the silicone thermoplastic-thermosetting adhesive composition is cooled to be solidified.

In this way, the LED device 7 including the LED package 10 in which the phosphor layer 3 is allowed to adhere to the upper surface thereof via the silicone pressure-sensitive adhesion layer 4 can be produced.

In the LED device 7, the percentage of the peel strength of the silicone pressure-sensitive adhesion composition for attaching the phosphor layer 3 to the LED package 10 is 30% or more, so that it has excellent heat resistance and durability. As a result, the LED device 7 is capable of ensuring excellent light emitting reliability over a long period of time.

In the embodiment in FIG. 8(*a*)-(*b*), as shown in FIG. 8 (*a*), first, the silicone pressure-sensitive adhesion layer 4 is laminated on the phosphor layer 3 to form the phosphor attaching sheet 6 and thereafter, as shown in FIG. 8 (*b*), the phosphor layer 3 in the phosphor attaching sheet 6 is attached to the LED package 10 via the silicone pressure-sensitive adhesion layer 4. On the other hand, for example, as shown in FIG. 9 (*a*), first, the silicone pressure-sensitive adhesion layer 4 is laminated on the upper surface of the LED package 10 and thereafter, as shown in FIG. 9 (*b*), the phosphor layer 3 can be attached to the LED package 10 via the silicone pressure-sensitive adhesion layer 4.

In this method, first, the LED package 10 is prepared.

Next, in this method, as shown by the lower side view in FIG. 9 (*a*), the silicone pressure-sensitive adhesion layer 4 is laminated on the upper surface of the LED package 10.

To be specific, when the silicone pressure-sensitive adhesive composition is prepared as a varnish, the varnish is applied or is applied dropwise onto the entire upper surface of the LED 2. In this way, a film of the silicone pressure-sensitive adhesive composition is formed. Subsequently, a solvent in the varnish is distilled off as required.

On the other hand, when the silicone pressure-sensitive adhesion composition is formed from the silicone thermoplastic-thermosetting adhesive composition, the LED package 10 is heated in advance and next, the silicone formed product 9 (ref: the phantom line in FIG. 2 (*a*)) is disposed on the upper surface of the LED package 10. In this way, the film 4' of the silicone thermoplastic-thermosetting adhesive composition is formed on the entire upper surface of the LED package 10.

Thereafter, as shown in FIG. 9 (*b*), the phosphor layer 3 is attached to the LED package 10 via the silicone pressure-sensitive adhesion layer 4. To be specific, the lower surface of the phosphor layer 3 is brought into contact with the upper surface of the silicone pressure-sensitive adhesion layer 4.

In the embodiment in FIG. 9(*a*)-(*b*), the same function and effect as that in the embodiment in FIG. 8(*a*)-(*b*) can be achieved.

In the embodiments in the FIGS., the LED 2 is illustrated and described as an optical semiconductor element of the present invention. Alternatively, for example, an LD (laser diode) 2 can be used.

In such a case, a laser diode irradiation device 7 serves as the LED device 7, an LD-phosphor layer pressure-sensitive adhesive body 1 serves as the LED-phosphor layer attaching body 1, and an LD package 10 serves as the LED package 10.

EXAMPLES

While the present invention will be described hereinafter in further detail with reference to Production Examples, Preparation Examples, Comparative Preparation Examples, Synthesis Examples, Examples, and Comparative Examples, the present invention is not limited to these Production Examples, Preparation Examples, Comparative Preparation Examples, Synthesis Examples, Examples, and Comparative Examples.

(Fabrication of Phosphor Ceramic Plate)

Production Example 1

Material powders of a phosphor prepared from 11.34 g of yttrium oxide particles (purity of 99.99%, lot: N-YT4CP, manufactured by NIPPON YTTRIUM CO., LTD.), 8.577 g of aluminum oxide particles (purity of 99.99%, part number "AKP-30", manufactured by Sumitomo Chemical Co., Ltd.), and 0.087 g of cerium oxide particles were prepared.

20 g of the prepared material powders of the phosphor and a water-soluble binder resin ("WB4101", manufactured by Polymer Innovations, Inc.) were mixed so as to have a volume ratio of the solid content of 60:40. Furthermore, distilled water was added to the obtained mixture to be poured into a vessel made of alumina. An yttrium stabilized zirconia ball having a diameter of 3 mm was added thereto and was wet-blended with a ball mill for 24 hours, so that a slurry solution of the material powders of the phosphor was prepared.

Next, the prepared slurry solution was tape-casted on a PET film by a doctor blade method and was dried at 70° C., so that a ceramic green sheet was formed. Thereafter, the ceramic green sheet was peeled from the PET film, so that a ceramic green sheet having a thickness of 90 μm was obtained.

Thereafter, the obtained green sheet was cut into pieces each having a size of 20 mm×20 mm. Two pieces thereof were fabricated and stacked to be thermally laminated using a biaxial hot press, so that a ceramic green sheet laminate was fabricated.

Thereafter, the fabricated ceramic green sheet laminate was heated up to 1200° C. at a temperature rising rate of 1° C./min in the air in an electric muffle furnace to perform a binder-removing treatment in which an organic component such as a binder resin was decomposed and removed. Then, the laminate was transferred into a high-temperature vacuum furnace and was heated up to 1750° C. at a temperature rising rate of 5° C./min in a reduced pressure atmosphere of about $10^{-3}$ Torr ($133 \times 10^{-3}$ N/cm$^2$) to be sintered at the temperature for five hours, so that a phosphor ceramic plate (a phosphor layer) having a thickness of 150 μm was fabricated.

(Fabrication of Phosphor Resin Sheet)

Production Example 2

A solution in which YAG phosphor powders (product number: BYW01A, an average particle size of 9 μm, manufactured by Phosphor Tech Corporation) were dispersed into a two-liquid mixed type thermosetting silicone elastomer (manufactured by Shin-Etsu Chemical Co., Ltd., part number: KER2500) so that the concentration of the YAG phosphor powders was 25 mass % was applied onto a glass plate using an applicator, so that a phosphor film having a thickness of 150 μm was formed. The obtained phosphor film was heated at 100° C. for one hour and subsequently, was heated at 150° C. for one hour, so that a phosphor resin sheet (a phosphor layer) in a C-stage state having a thickness of 150 μm was fabricated.

(Preparation of Silicone Pressure-Sensitive Adhesive Composition)

Preparation Example 1

A silicone pressure-sensitive adhesive composition (trade name: PSA 600, manufactured by General Electric Company) was prepared.

Materials of the silicone pressure-sensitive adhesive composition were as follows.

Polydimethylsiloxane containing silanol groups at both ends
Octamethylcyclotetrasiloxane (where, in formula (B), R$^a$: all methyl and "m": 3)
1 to 5 mass % (with respect to the total amount of the solid content)
Mixture of benzoyl peroxides (a mixture of dibenzoyl peroxide, benzoyl m-methylbenzoyl peroxide, and m-toluoyl peroxide)
a small amount
Toluene
45 mass % with respect to the solid content
(Synthesis of Cage Octasilsesquioxane)

Synthesis Example 1

35.8 mL (160.6 mol) of tetraethoxysilane was gradually added dropwise to a liquid mixture of 66.8 mL (158.6 mol) of tetramethyl ammonium hydride (a 25% methanol solution), 32.8 mL of methanol, and 24.6 mL of distilled water. The obtained mixture was stirred for a whole day to be allowed to react.

Then, the reaction liquid was filtrated and the filtrate was added dropwise to a liquid mixture of 428 mL of hexane, 7.1 g (75 mmol) of dimethylchlorosilane, and 24.4 g (225 mmol) of trimethylchlorosilane. The obtained mixture was stirred for a whole day. Thereafter, the reacting product was extracted with hexane and magnesium sulfate was added to the extract to be dried. Thereafter, the hexane was once removed and then, the hexane was further added to the obtained mixture so as to cause recrystallization, so that a white and solid cage octasilsesquioxane was obtained.

It was confirmed by a $^1$H-NMR that the obtained cage octasilsesquioxane had a structure in formula (7), and R$^6$ was a methyl group and R$^7$ was hydrogen or a methyl group in formula (7). The molar ratio (an average value in the cage octasilsesquioxane as a whole) of the methyl group to the hydrogen in R$^7$ was calculated and determined to be methyl group: hydrogen=6:2.

(Preparation of Silicone Thermoplastic-Thermosetting Adhesive Composition)

Preparation Example 2

0.3 g of the cage octasilsesquioxane (R$^7$/methyl group: hydrogen (molar ratio)=6:2 in formula (7)) in Synthesis Example 1, 0.24 g of a polysiloxane containing alkenyl groups at both ends (in formula (8), R$^8$ is a methyl group, R$^9$ is a vinyl group, "i" is 8, a number average molecular weight of 800, manufactured by Gelest, Inc.), 1 g of toluene, and 0.5 μL of a platinum-divinylsiloxane complex solution (a hydrosilylation catalyst, a toluene solution, a platinum concentration of 2 mass %) were blended and the obtained mixture was stirred at 50° C. for 15 hours. The molar ratio (=vinyl group/hydrosilyl group) of the vinyl group in the polysiloxane containing alkenyl groups at both ends to the hydrosilyl group in the cage octasilsesquioxane was 0.91.

Thereafter, the toluene was distilled off, so that a transparent and solid third silicone thermoplastic-thermosetting adhesive composition was obtained.

Preparation Example 3

5 g (0.43 mmol) of a silicone resin composition containing amino groups at both ends (a compound in which all of R$^1$s are methyl groups, R$^3$s are propylene groups, "a"=150, "b"=0 in formula (1), a weight average molecular weight of 11,400, manufactured by Shin-Etsu Chemical Co., Ltd.), 0.074 g (0.43 mmol) of tolylene2,4-diisocyanate, and 10 mL of methyl ethyl ketone were stirred and mixed under a nitrogen atmosphere at a room temperature (25° C.) for one hour. Thereafter, 1315 μL (0.1 mol % of a radical generator with respect to 100 mol % of R$^1$ group in the silicone resin composition containing amino groups at both ends) of di-t-butyl peroxide (0.1 mol/L of a benzene solution, manufactured by NOF CORPORATION) was added to the obtained mixture to be stirred and mixed at a room temperature (25° C.) for one hour. Thereafter, a solvent was removed under a reduced pressure at a room temperature (25° C.), so that a transparent and solid first silicone thermoplastic-thermosetting adhesive composition was obtained.

(Preparation of Silicone Curable-Type Adhesive Composition)

Comparative Preparation Example 1

A silicone pressure-sensitive adhesive composition (trade name: SD 4580 PSA, manufactured by Dow Corning Toray Co., Ltd.) was prepared.

Materials of the silicone pressure-sensitive adhesive composition were as follows.
Polydimethylsiloxane containing silanol groups at both ends
Mixture of benzoyl peroxides (a mixture of dibenzoyl peroxide, benzoyl m-methylbenzoyl peroxide, and m-toluoyl peroxide)
a small amount
Toluene
70 mass % with respect to the solid content (Preparation of Acrylic Pressure-Sensitive Adhesive Composition)

Comparative Preparation Example 2

An acrylic pressure-sensitive adhesive was prepared with reference to the formulation of Example 2 in Japanese Unexamined Patent Publication No. H6-172729.

(Fabrication of Optical Semiconductor Package)

Production Example 3

A metal core substrate having a conductive pattern on a laminated substrate in which an insulating layer was laminated on a metal substrate was prepared. Next, an optical semiconductor element (a blue LED, part number: C450EZ1000-0123, manufactured by Cree, Inc.) was wire-bonding connected to the metal core substrate to be mounted (ref: the lower side view in FIG. 6 (*a*)).

Production Example 4

A multilayer ceramic substrate (part number: 207806, manufactured by Sumitomo Metal (SMI) Electronics Devices Inc.) in which a reflector that defined a concave portion (a cavity) in a generally elliptical shape was laminated on a substrate and a conductive pattern was formed in a portion on the substrate in the concave portion was prepared.

Next, an optical semiconductor element (a blue LED, part number: C450EZ1000-0123, manufactured by Cree, Inc.) was wire-bonding connected to the multilayer ceramic substrate.

Next, a two-liquid mixed type thermosetting silicone elastomer (part number: KER 2500, manufactured by Shin-Etsu Chemical Co., Ltd.) was potted into the cavity to be thereafter heated at 100° C. for one hour and then, at 150° C. for one hour to be cured.

In this way, an encapsulating layer was formed (ref: the lower side view in FIG. 8 (*a*)).

In this way, an optical semiconductor package was fabricated.

(Fabrication of Phosphor Attaching Sheet)

Example 1-a

The phosphor ceramic plate in Production Example 1 was cut into a predetermined size (3.5 mm×2.8 mm or 1 mm×1 mm and in the case of applying to the optical semiconductor package in Production Example 3, a cut was fabricated in accordance with the position of the wire-bonding) (ref: FIG. 2 (*a*)). Thereafter, the silicone pressure-sensitive adhesive composition in Preparation Example 1 was applied to the entire upper surface of the phosphor ceramic plate to form a film. Subsequently, a solvent was distilled off.

In this way, a silicone pressure-sensitive adhesive layer having a thickness of 40 μm was formed on the upper surface of the phosphor ceramic plate (ref: FIG. 2 (*b*)). That is, a phosphor attaching sheet made of the phosphor ceramic plate and the silicone pressure-sensitive adhesive layer was fabricated.

(Production of Optical Semiconductor Device/Without Cavity)

Example 1-b

A phosphor layer in the phosphor attaching sheet having a size of 1 mm×1 mm in Example 1-a was attached to the upper surface of the optical semiconductor element mounted on the substrate in Production Example 3 via the silicone pressure-sensitive adhesive layer at 25° C.

In this way, an optical semiconductor device was produced (ref: FIG. 6 (*b*)).

(Production of Optical Semiconductor Device/With Cavity)

Example 1-c

A phosphor layer in the phosphor attaching sheet having a size of 3.5 mm×2.8 mm in Example 1-a was attached to the upper surface of the optical semiconductor package in Production Example 4 via the silicone pressure-sensitive adhesive layer at 25° C.

In this way, an optical semiconductor device was produced (ref: FIG. 8 (*b*)).

(Fabrication of Phosphor Attaching Sheet)

Example 2-a

A phosphor attaching sheet was fabricated (ref: FIG. 2 (*b*)) in the same manner as in Example 1-a, except that the phosphor resin sheet (ref: FIG. 2 (*a*)) in Production Example 2 was used instead of the phosphor ceramic plate in Production Example 1.

(Production of Optical Semiconductor Device/without Cavity)

Example 2-b

An optical semiconductor device was produced (ref: FIG. 6 (*b*)) in the same manner as in Example 1-b, except that the phosphor attaching sheet (ref: FIG. 2 (*b*)) in Example 2-a was used instead of the phosphor attaching sheet in Example 1-a.

(Production of Optical Semiconductor Device/with Cavity)

Example 2-c

An optical semiconductor device was produced (ref: FIG. 8 (*b*)) in the same manner as in Example 1-c, except that the phosphor attaching sheet (ref: FIG. 2 (*b*)) in Example 2-a was used instead of the phosphor attaching sheet in Example 1-a.

(Production of Phosphor Attaching Sheet)

Example 3-a

The phosphor ceramic plate in Production Example 1 was cut into a predetermined size (3.5 mm×2.8 mm or 1 mm×1 mm and in the case of applying to the optical semiconductor package in Production Example 3, a cut was fabricated in accordance with the position of the wire-bonding). The obtained product was disposed on a hot plate heated at 100° C. (ref: the solid line in FIG. 2 (*a*)).

Next, 1 mg of a silicone formed product prepared from the third silicone thermoplastic-thermosetting adhesive composition in Preparation Example 2 was disposed in the center on the upper surface of the phosphor ceramic plate (ref: the phantom line in FIG. 2 (*a*)).

Then, immediately after the disposition, the silicone formed product was plasticized (liquefied) to be uniformly dispersed on the entire upper surface of the phosphor ceramic plate, so that a film of the silicone thermoplastic-thermosetting adhesive composition was formed (ref: the arrows in phantom lines in FIG. 2 (*a*) and FIG. 2 (*b*)).

Thereafter, the phosphor ceramic plate was taken out from the hot plate to be cooled to a room temperature. In this way, the third silicone thermoplastic-thermosetting adhesive composition was solidified.

In this way, a phosphor attaching sheet in which a silicone thermoplastic-thermosetting adhesive layer having a thickness of about 100 μm was formed on the phosphor layer prepared from the phosphor ceramic plate was obtained (ref: FIG. 2 (*b*)).

(Production of Optical Semiconductor Device/without Cavity)

Example 3-b

In Example 3-a, the phosphor ceramic plate (the phosphor ceramic plate before being cooled, a size of 1 mm×1 mm) that was heated in the hot plate and in which the silicone formed product was plasticized, and the substrate in Production Example 3 that was heated in the hot plate and the optical semiconductor element that was mounted thereon (ref: the lower side view in FIG. 6 (*a*)) were prepared. The temperatures of both were confirmed to be the same and then, the phosphor ceramic plate was attached to the upper surface of the optical semiconductor element via the plasticized silicone formed product. Thereafter, the resulting product was taken out from the hot plate to be cooled to a room temperature. In this way, an optical semiconductor device was produced (ref: FIG. 6 (*b*)).

(Production of Optical Semiconductor Device/with Optical Semiconductor Package)

Example 3-c

An optical semiconductor device was fabricated (ref: FIG. 8 (*b*)) in the same manner as in Example 3-b, except that the substrate and the optical semiconductor element in Example 3-b were changed to the optical semiconductor package (ref: the lower side view in FIG. 8 (*a*)) in Production Example 4 and furthermore, the phosphor ceramic plate in which the silicone formed product was plasticized and having a size of 3.5 mm×2.8 mm was used.

(Fabrication of Phosphor Attaching Sheet)

Example 4-a

A phosphor attaching sheet was obtained (ref: FIG. 2 (*b*)) in the same manner as in Example 3-a, except that the phosphor resin sheet in Production Example 2 was used instead of the phosphor ceramic plate in Production Example 1.

(Production of Optical Semiconductor Device/without Cavity)

Example 4-b

An optical semiconductor device was produced (ref: FIG. 6 (*b*)) in the same manner as in Example 3-b, except that the phosphor attaching sheet in Example 4-a was used instead of the phosphor attaching sheet in Example 3-a.

(Production of Optical Semiconductor Device/with Cavity)

Example 4-c

An optical semiconductor device was produced (ref: FIG. 8 (*b*)) in the same manner as in Example 3-c, except that the phosphor attaching sheet in Example 4-a was used instead of the phosphor attaching sheet in Example 3-a.

(Production of Phosphor Attaching Sheet)

Example 5-a

The phosphor ceramic plate in Production Example 1 was cut into a predetermined size (3.5 mm×2.8 mm or 1 mm×1 mm and in the case of applying to the optical semiconductor package in Production Example 3, a cut was fabricated in accordance with the position of the wire-bonding). The obtained product was disposed on a hot plate heated at 100° C. (ref: the solid line in FIG. 2 (*a*)).

Next, 1 mg of a silicone formed product prepared from the first silicone thermoplastic-thermosetting adhesive composition in Preparation Example 3 was disposed in the center on the upper surface of the phosphor ceramic plate (ref: the phantom line in FIG. 2 (*a*)).

Then, immediately after the disposition, the silicone formed product was plasticized (liquefied) to be uniformly dispersed on the entire upper surface of the phosphor ceramic plate, so that a film of the silicone thermoplastic-thermosetting adhesive composition was formed (ref: the arrows in phantom lines in FIG. 2 (*a*) and FIG. 2 (*b*)).

Thereafter, the phosphor ceramic plate was taken out from the hot plate to be cooled to a room temperature. In this way, the first silicone thermoplastic-thermosetting adhesive composition was solidified.

In this way, a phosphor attaching sheet in which a silicone thermoplastic-thermosetting adhesive layer having a thickness of about 100 μm was formed on the phosphor layer prepared from the phosphor ceramic plate was obtained (ref: FIG. 2 (*b*)).

(Production of Optical Semiconductor Device/without Cavity)

Example 5-b

In Example 5-a, the phosphor ceramic plate (the phosphor ceramic plate before being cooled, a size of 1 mm×1 mm) that was heated in the hot plate and in which the silicone formed product was plasticized, and the substrate in Production Example 3 that was heated in the hot plate and the optical semiconductor element that was mounted thereon (ref: the lower side view in FIG. 6 (*a*)) were prepared. The temperatures of both were confirmed to be the same and then, the phosphor ceramic plate was attached to the upper surface of the optical semiconductor element via the plasticized silicone formed product. Thereafter, the resulting product was taken out from the hot plate to be cooled to a room temperature. In this way, an optical semiconductor device was produced (ref: FIG. 6 (*b*)).

(Production of Optical Semiconductor Device/with Cavity)

Example 5-c

An optical semiconductor device was fabricated (ref: FIG. 8 (*b*)) in the same manner as in Example 5-b, except that the substrate and the optical semiconductor element in Example 5-b were changed to the optical semiconductor package (ref: the lower side view in FIG. 8 (*a*)) in Production Example 4 and furthermore, the phosphor ceramic plate in which the silicone formed product was plasticized and having a size of 3.5 mm×2.8 mm was used.

(Fabrication of Phosphor Attaching Sheet)

Example 6-a

A phosphor attaching sheet was obtained (ref: FIG. 2 (*b*)) in the same manner as in Example 5-a, except that the phosphor resin sheet in Production Example 2 was used instead of the phosphor ceramic plate in Production Example 1.

(Production of Optical Semiconductor Device/without Cavity)

Example 6-b

An optical semiconductor device was produced (ref: FIG. 6 (*b*)) in the same manner as in Example 5-b, except that the phosphor attaching sheet in Example 6-a was used instead of the phosphor attaching sheet in Example 5-a.

(Production of Optical Semiconductor Device/with Cavity)

Example 6-c

An optical semiconductor device was produced (ref: FIG. 8 (*b*)) in the same manner as in Example 5-c, except that the phosphor attaching sheet in Example 6-a was used instead of the phosphor attaching sheet in Example 5-a.

(Fabrication of Phosphor Attaching Sheet)

Comparative Example 1-a

The phosphor ceramic plate in Production Example 1 was cut into a predetermined size (3.5 mm×2.8 mm or 1 mm×1 mm and in the case of applying to the optical semiconductor package in Production Example 3, a cut was fabricated in accordance with the position of the wire-bonding) (ref: FIG. 2 (*a*)). Thereafter, the silicone pressure-sensitive adhesive composition in Comparative Preparation Example 1 was applied to the entire upper surface of the phosphor ceramic plate to form a film. Subsequently, a solvent was distilled off.

In this way, a silicone pressure-sensitive adhesive layer having a thickness of 40 μm was formed on the upper surface of the phosphor ceramic plate (ref: FIG. 2 (*b*)). That is, a phosphor attaching sheet made of the phosphor ceramic plate and the silicone pressure-sensitive adhesive layer was fabricated.

(Production of Optical Semiconductor Device/without Cavity)

Comparative Example 1-b

A phosphor layer in the phosphor attaching sheet having a size of 1 mm×1 mm in Comparative Example 1-a was attached to the upper surface of the optical semiconductor element mounted on the substrate in Production Example 3 via the silicone pressure-sensitive adhesive layer at 25° C.

In this way, an optical semiconductor device was produced (ref: FIG. 6 (*b*)).

(Production of Optical Semiconductor Device/with Cavity)

Comparative Example 1-c

A phosphor layer in the phosphor attaching sheet having a size of 3.5 mm×2.8 mm in Comparative Example 1-a was attached to the upper surface of the optical semiconductor package in Production Example 4 via the silicone pressure-sensitive adhesive layer at 25° C.

In this way, an optical semiconductor device was produced (ref: FIG. 8 (*b*)).

(Fabrication of Phosphor Attaching Sheet)

Comparative Example 2-a

A phosphor attaching sheet was fabricated (ref: FIG. 2 (*b*)) in the same manner as in Comparative Example 1-a, except that the phosphor resin sheet (ref: FIG. 2 (*a*)) in Production Example 2 was used instead of the phosphor ceramic plate in Production Example 1.

(Production of Optical Semiconductor Device/without Cavity)

Comparative Example 2-b

An optical semiconductor device was produced (ref: FIG. 6 (*b*)) in the same manner as in Comparative Example 1-b, except that the phosphor attaching sheet (ref: FIG. 2 (*b*)) in Comparative Example 2-a was used instead of the phosphor attaching sheet in Comparative Example 1-a.

(Production of Optical Semiconductor Device/with Cavity)

Comparative Example 2-c

An optical semiconductor device was produced (ref: FIG. 8 (*b*)) in the same manner as in Comparative Example 1-c, except that the phosphor attaching sheet (ref: FIG. 2 (*b*)) in Comparative Example 2-a was used instead of the phosphor attaching sheet in Comparative Example 1-a.

(Fabrication of Phosphor Attaching Sheet)

Comparative Example 3-a

The phosphor ceramic plate in Production Example 1 was cut into a predetermined size (3.5 mm×2.8 mm or 1 mm×1 mm and in the case of applying to the optical semiconductor package in Production Example 3, a cut was fabricated in accordance with the position of the wire-bonding) (ref: FIG. 2 (*a*)). Thereafter, the acrylic pressure-sensitive adhesive composition in Comparative Preparation Example 2 was applied to the entire upper surface of the phosphor ceramic plate to form a film. Subsequently, a solvent was distilled off.

In this way, an acrylic pressure-sensitive adhesive layer having a thickness of 40 μm was formed on the upper surface of the phosphor ceramic plate (ref: FIG. 2 (*b*)). That is, a phosphor attaching sheet made of the phosphor ceramic plate and the acrylic pressure-sensitive adhesive layer was fabricated.

(Production of Optical Semiconductor Device/without Cavity)

Comparative Example 3-b

A phosphor layer in the phosphor attaching sheet having a size of 1 mm×1 mm in Comparative Example 3-a was attached to the upper surface of the optical semiconductor element mounted on the substrate in Production Example 3 via the acrylic pressure-sensitive adhesive layer at 25° C.

In this way, an optical semiconductor device was produced (ref: FIG. 6 (b)).

(Production of Optical Semiconductor Device/with Cavity)

Comparative Example 1-c

A phosphor layer in the phosphor attaching sheet having a size of 3.5 mm×2.8 mm in Comparative Example 1-a was attached to the upper surface of the optical semiconductor package in Production Example 4 via the acrylic pressure-sensitive adhesive layer at 25° C.

In this way, an optical semiconductor device was produced (ref: FIG. 8 (b)).

(Fabrication of Phosphor Attaching Sheet)

Comparative Example 4-a

A phosphor attaching sheet was fabricated (ref: FIG. 2 (b)) in the same manner as in Comparative Example 3-a, except that the phosphor resin sheet (ref: FIG. 2 (a)) in Production Example 2 was used instead of the phosphor ceramic plate in Comparative Example 3.

(Production of Optical Semiconductor Device/without Cavity)

Comparative Example 4-b

An optical semiconductor device was produced (ref: FIG. 6 (b)) in the same manner as in Comparative Example 3-b, except that the phosphor attaching sheet (ref: FIG. 2 (b)) in Comparative Example 4-a was used instead of the phosphor attaching sheet in Comparative Example 3-a.

(Production of Optical Semiconductor Device/with Cavity)

Comparative Example 4-c

An optical semiconductor device was produced (ref: FIG. 8 (b)) in the same manner as in Comparative Example 3-c, except that the phosphor attaching sheet (ref: FIG. 2 (b)) in Comparative Example 4-a was used instead of the phosphor attaching sheet in Comparative Example 3-a.

The combinations and the evaluation results of materials used in each of the phosphor layers and each of the pressure-sensitive adhesion compositions in Examples and Comparative Examples are shown in Table 1.

TABLE 1

| | Phosphor Layer Attaching Kit | | | Optical Semiconductor Package | | Peel Strength | Light Emitting Reliability |
|---|---|---|---|---|---|---|---|
| | Pressure-Sensitive Adhesion Composition | Phosphor Layer | Classification | | Classification | (Evaluation 1) | (Evaluation 2) |
| Ex. 1 | Silicone Pressure-Sensitive Adhesive Composition (Preparation Ex. 1) | Phosphor Ceramic Plate (Production Ex. 1) | (Ex. 1-a) | Without Cavity (Production Ex. 3) | (Ex. 1-b) | Sufficiently Strong | 99% (Ex. 1-b) |
| | | | | With Cavity (Production Ex. 4) | (Ex. 1-c) | 3.5/7.1 = 49% | |
| Ex. 2 | | Phosphor Resin Sheet (Production Ex. 2) | (Ex. 2-a) | Without Cavity (Production Ex. 3) | (Ex. 2-b) | | |
| | | | | With Cavity (Production Ex. 4) | (Ex. 2-c) | | |
| Ex. 3 | Third Silicone Thermoplastic-Thermosetting Adhesive Composition | Phosphor Ceramic Plate (Production Ex. 1) | | Without Cavity (Production Ex. 3) | (Ex. 3-b) | Sufficiently Strong | 99% (Ex. 3-b) |
| | | | | With Cavity (Production Ex. 4) | (Ex. 3-c) | 1.8/2.1 = 85% | |
| Ex. 4 | (Preparation Ex. 2) | Phosphor Resin Sheet (Production Ex. 2) | (Ex. 4-a) | Without Cavity (Production Ex. 3) | (Ex. 4-b) | | |
| | | | | With Cavity (Production Ex. 4) | (Ex. 4-c) | | |
| Ex. 5 | First Silicone Thermoplastic-Thermosetting Adhesive Composition | Phosphor Ceramic Plate (Production Ex. 1) | (Ex. 5-a) | Without Cavity (Production Ex. 3) | (Ex. 5-b) | Sufficiently Strong | 95% (Ex. 5-b) |
| | | | | With Cavity (Production Ex. 4) | (Ex. 5-c) | 2.0/2.4 = 83% | |
| Ex. 6 | (Preparation Ex. 3) | Phosphor Resin Sheet (Production Ex. 2) | | Without Cavity (Production Ex. 3) | (Ex. 6-b) | | |
| | | | | With Cavity (Production Ex. 4) | (Ex. 6-c) | | |
| Comp. Ex. 1 | Silicone Pressure-Sensitive Adhesive Composition (Comp. Preparation Ex. 1) | Phosphor Ceramic Plate (Production Ex. 1) | (Comp. Ex. 1-a) | Without Cavity (Production Ex. 3) | (Comp. Ex. 1-b) | Weak 0.31/1.2 = 26% | Unmeasurable* |
| | | | | With Cavity (Production Ex. 4) | (Comp. Ex. 1-c) | | |
| Comp. Ex. 2 | | Phosphor Resin Sheet (Production Ex. 2) | (Comp. Ex. 2-a) | Without Cavity (Production Ex. 3) | (Comp. Ex. 2-b) | | |
| | | | | With Cavity (Production Ex. 4) | (Comp. Ex. 2-c) | | |
| Comp. Ex. 3 | Acrylic Pressure-Sensitive Adhesive Composition (Comp. Preparation Ex. 2) | Phosphor Ceramic Plate (Production Ex. 1) | | Without Cavity (Production Ex. 3) | (Comp. Ex. 3-b) | Sufficiently Strong | 63% Reduction in Brightness due to Deterioration of Acrylic |
| | | | | With Cavity (Production Ex. 4) | (Comp. Ex. 3-c) | 3.5/5.8 = 60% | |
| Comp. Ex. 4 | | Phosphor Resin Sheet (Production Ex. 2) | (Comp. Ex. 4-a) | Without Cavity (Production Ex. 3) | (Comp. Ex. 4-b) | | |
| | | | | With Cavity (Production Ex. 4) | (Comp. Ex. 4-c) | | |

TABLE 1-continued

| Phosphor Layer Attaching Kit | | | Optical Semiconductor Package | Peel Strength | Light Emitting Reliability |
|---|---|---|---|---|---|
| Pressure-Sensitive Adhesion Composition | Phosphor Layer | Classification | Classification | (Evaluation 1) | (Evaluation 2) |
| | | | | | Pressure-Sensitive Adhesive Layer (Comp. Ex. 3-b) |

*Unmeasurable because the silicone pressure-sensitive adhesive layer is peeled from the phosphor ceramic plate.

(Evaluation)

The peel strength of each of the pressure-sensitive adhesion layers (the pressure-sensitive adhesion compositions) in Examples and Comparative Examples with respect to the phosphor layer was evaluated by the following method.

The light emitting reliability at the time of lighting up each of the optical semiconductor devices in Examples and Comparative Examples with the passing of time was evaluated. The results are shown in Table 1.

1. Peel Strength

The peel strength under an atmosphere at 25° and 75° C. of the pressure-sensitive adhesion layer with respect to the phosphor ceramic plate was calculated by a removing adhesive force measurement [N/19 mm] at a width of 19 mm.

To be more specific, a pressure-sensitive adhesion composition was applied onto the surface of a polyimide film having a thickness of 25 µm as a support so as to have a width of 19 mm and a thickness of 40 µm. In this way, a pressure-sensitive adhesion layer laminated on the support was formed. Next, a polyimide film including the pressure-sensitive adhesion layer was compressively bonded to a phosphor ceramic plate having a size of 20 mm×20 mm by one reciprocation of a 2 kg roller on the polyimide film. After the compression bonding, the obtained product was allowed to stand for about 30 minutes and then, was set in a tensile test device (name of device: manufactured by Shimadzu Corporation, tensile test device in thermostatic chamber: AUTOGRAPH AG-10kNX) provided in a thermostatic chamber in which the temperature was set to be a predetermined temperature to be retained under the following temperature atmosphere for five minutes. Thereafter, the polyimide film, along with the pressure-sensitive adhesion layer, was removed (peeled) from the phosphor ceramic plate under the following conditions and the removing adhesive force at the time was measured as the peel strength.

Temperature in thermostatic chamber: 25° C. or 75° C.
Peeling (removing) conditions: peel angle of 180 degrees
Peeling (removing) conditions: tensile rate of 300 mm/min After the measurement, a percentage ([$PS_{75°\,C.}/PS_{25°\,C.}$]×100) of the peel strength $PS_{75°\,C.}$ [N/19 mm] in an atmosphere at 75° C. with respect to the peel strength $PS_{25°\,C.}$ [N/19 mm] in an atmosphere at 25° C. was calculated.

2. Surface Temperature of Phosphor Layer at Time of Lighting Up Optical Semiconductor Device Each of the optical semiconductor devices in Examples and Comparative Examples was connected to a heat sink in a sufficient size by thermally conductive grease and was also electrically connected to a power source. Next, an electric current of 350 mA was applied from the power source to measure the light emission brightness (the initial brightness) of each of the optical semiconductor devices at the time of being subjected to initial light emission and the brightness (the brightness after 30 days) thereof after being allowed to emit light continuously for 30 days, respectively.

A percentage ([brightness after 30 days/initial brightness]×100) of the brightness after 30 days with respect to the initial brightness was calculated.

In Comparative Examples 1-b to 2-c, the silicone pressure-sensitive adhesive layer was peeled from the phosphor ceramic plate. Thus, the brightness after 30 days was not capable of being measured and therefore, the above-described percentage was not capable of being calculated.

While the illustrative embodiments of the present invention are provided in the above description, such is for illustrative purpose only and it is not to be construed as limiting the scope of the present invention. Modification and variation of the present invention that will be obvious to those skilled in the art is to be covered by the following claims.

What is claimed is:

1. A phosphor layer attaching kit comprising:
   a phosphor layer and
   a silicone pressure-sensitive adhesion composition for attaching the phosphor layer to an optical semiconductor element or an optical semiconductor element package, wherein
   a percentage of peel strength of the silicone pressure-sensitive adhesion composition is 30% or more, and is defined as follows:

Percentage of peel strength=[(peel strength $PS_{75°\,C.}$ in an atmosphere at 75° C.)/(peel strength $PS_{25°\,C.}$ in an atmosphere at 25° C.)]×100;

wherein Peel Strength $PS_{75°\,C.}$ in an atmosphere at 75° C.: a peel strength at a temperature of 75° C. at the time of peeling a support and a pressure-sensitive adhesion layer from the phosphor layer at a peel angle of 180 degrees and a rate of 300 mm/min after attaching the pressure-sensitive adhesion layer formed from the silicone pressure-sensitive adhesion composition and laminated on the support to the phosphor layer, and Peel Strength $PS_{25°\,C.}$ in an atmosphere at 25° C.: a peel strength at a temperature of 25° C. at the time of peeling a support and a pressure-sensitive adhesion layer from the phosphor layer at a peel angle of 180 degrees and a rate of 300 mm/min after attaching the pressure-sensitive adhesion layer formed from the silicone pressure-sensitive adhesion composition and laminated on the support to the phosphor layer.

2. The phosphor layer attaching kit according to claim 1, wherein the silicone pressure-sensitive adhesion composition is a silicone pressure-sensitive adhesive composition.

3. The phosphor layer attaching kit according to claim 1, wherein the silicone pressure-sensitive adhesion composition is a silicone thermoplastic-thermosetting adhesive composition having both thermoplastic properties and thermosetting properties.

4. An optical semiconductor element-phosphor layer attaching body comprising:

an optical semiconductor element, and a phosphor attaching sheet fabricated from a phosphor layer attaching kit including a phosphor layer and a silicone pressure-sensitive adhesion composition for attaching the phosphor layer to the optical semiconductor element and allowing the phosphor layer to be attached to the optical semiconductor element via the silicone pressure-sensitive adhesion composition, wherein a percentage of peel strength of the silicone pressure-sensitive adhesion composition is 30% or more, and is defined as follows:

Percentage of peel strength=[(peel strength $PS_{75°\,C.}$ in an atmosphere at 75° C.)/(peel strength $PS_{25°\,C.}$ in an atmosphere at 25° C.)]×100;

wherein Peel Strength $PS_{75°\,C.}$ in an atmosphere at 75° C.: a peel strength at a temperature of 75° C. at the time of peeling a support and a pressure-sensitive adhesion layer from the phosphor layer at a peel angle of 180 degrees and a rate of 300 mm/min after attaching the pressure-sensitive adhesion layer formed from the silicone pressure-sensitive adhesion composition and laminated on the support to the phosphor layer, and Peel Strength $PS_{25°\,C.}$ in an atmosphere at 25° C.: a peel strength at a temperature of 25° C. at the time of peeling a support and a pressure-sensitive adhesion layer from the phosphor layer at a peel angle of 180 degrees and a rate of 300 mm/min after attaching the pressure-sensitive adhesion layer formed from the silicone pressure-sensitive adhesion composition and laminated on the support to the phosphor layer.

5. An optical semiconductor device comprising:

a substrate, an optical semiconductor element to be mounted on the substrate, and a phosphor attaching sheet fabricated from a phosphor layer attaching kit according to claim 1, wherein the phosphor layer is attached to the optical semiconductor element via the silicone pressure-sensitive adhesion composition, wherein a percentage of peel strength of the silicone pressure-sensitive adhesion composition is 30% or more, and is defined as follows:

Percentage of peel strength=[(peel strength $PS_{75°\,C.}$ in an atmosphere at 75° C.)/(peel strength $PS_{25°\,C.}$ in an atmosphere at 25° C.)]×100;

wherein Peel Strength $PS_{75°\,C.}$ in an atmosphere at 75° C.: a peel strength at a temperature of 75° C. at the time of peeling a support and a pressure-sensitive adhesion layer from the phosphor layer at a peel angle of 180 degrees and a rate of 300 mm/min after attaching the pressure-sensitive adhesion layer formed from the silicone pressure-sensitive adhesion composition and laminated on the support to the phosphor layer, and Peel Strength $PS_{25°\,C.}$ in an atmosphere at 25° C.: a peel strength at a temperature of 25° C. at the time of peeling a support and a pressure-sensitive adhesion layer from the phosphor layer at a peel angle of 180 degrees and a rate of 300 mm/min after attaching the pressure-sensitive adhesion layer formed from the silicone pressure-sensitive adhesion composition and laminated on the support to the phosphor layer.

6. An optical semiconductor device comprising:

an optical semiconductor package including a substrate, an optical semiconductor element to be mounted on the substrate, a reflector formed at one side in a thickness direction of the substrate and disposed, when projected in the thickness direction, so as to surround the optical semiconductor element, and an encapsulating layer filling the inside of the reflector and encapsulating the optical semiconductor element and a phosphor attaching sheet fabricated from a phosphor layer attaching kit according to claim 1, and the phosphor layer is attached to the one side in the thickness direction of the optical semiconductor package via the silicone pressure-sensitive adhesion composition, wherein a percentage of the following peel strength of the silicone pressure-sensitive adhesion composition is 30% or more, and is defined as follow:

Percentage of peel strength=[(peel strength $PS_{75°\,C.}$ in an atmosphere at 75° C.)/(peel strength $PS_{25°\,C.}$ in an atmosphere at 25° C.)]×100;

wherein Peel Strength $PS_{75°\,C.}$ in an atmosphere at 75° C.: a peel strength at a temperature of 75° C. at the time of peeling a support and a pressure-sensitive adhesion layer from the phosphor layer at a peel angle of 180 degrees and a rate of 300 mm/min after attaching the pressure-sensitive adhesion layer formed from the silicone pressure-sensitive adhesion composition and laminated on the support to the phosphor layer, and Peel Strength $PS_{25°\,C.}$ in an atmosphere at 25° C.: a peel strength at a temperature of 25° C. at the time of peeling a support and a pressure-sensitive adhesion layer from the phosphor layer at a peel angle of 180 degrees and a rate of 300 mm/min after attaching the pressure-sensitive adhesion layer formed from the silicone pressure-sensitive adhesion composition and laminated on the support to the phosphor layer.

\* \* \* \* \*